United States Patent
Mehr

(10) Patent No.: US 11,562,207 B2
(45) Date of Patent: Jan. 24, 2023

(54) SET OF NEURAL NETWORKS

(71) Applicant: DASSAULT SYSTEMES, Velizy Villacoublay (FR)

(72) Inventor: Eloi Mehr, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 481 days.

(21) Appl. No.: 16/727,092

(22) Filed: Dec. 26, 2019

(65) Prior Publication Data
US 2020/0210814 A1    Jul. 2, 2020

(30) Foreign Application Priority Data

Dec. 29, 2018 (EP) .................................... 18306883

(51) Int. Cl.
*G06N 3/04* (2006.01)
*G06N 20/00* (2019.01)
(Continued)

(52) U.S. Cl.
CPC ........... *G06N 3/0454* (2013.01); *G06F 30/27* (2020.01); *G06N 5/04* (2013.01); *G06N 20/00* (2019.01); *G06T 17/00* (2013.01); *G06T 19/003* (2013.01)

(58) Field of Classification Search
CPC ........ G06N 20/00; G06N 3/0454; G06N 3/08; G06N 3/088; G06N 5/04; G06F 30/02
(Continued)

(56) References Cited

U.S. PATENT DOCUMENTS 10,839,267 B2 * 11/2020 Mehr ................... G06K 9/6274
11,274,929 B1 *  3/2022 Afrouzi ............... G05D 1/0272
(Continued)

FOREIGN PATENT DOCUMENTS

EP    3 396 603 A1    10/2018

OTHER PUBLICATIONS

Xinchen Yin, "Perspective Transformer Nets: Learning Single-View 3D Object Reconstruction without 3D Supervision," Aug. 13, 2017, 30th Conference on Neural Information Processing Systems (NIPS 2016), Barcelona, Spain, pp. 1-10.
(Continued)

*Primary Examiner* — James A Thompson
(74) *Attorney, Agent, or Firm* — Oblon, McClelland, Maier & Neustadt, L.L.P.

(57) ABSTRACT

The disclosure notably relates to a computer-implemented method of machine-learning. The method includes obtaining a dataset including 3D modeled objects which each represent a respective mechanical part and further includes providing a set of neural networks. Each neural network has respective weights. Each neural network is configured for inference of 3D modeled objects. The method further includes modifying respective weights of the neural networks by minimizing a loss. For each 3D modeled object, the loss selects a term among a plurality of terms. Each term penalizes a disparity between the 3D modeled object and a respective 3D modeled object inferred by a respective neural network of the set. The selected term is a term among the plurality of terms for which the disparity is the least penalized. This constitutes an improved method of machine-learning with a dataset including 3D modeled objects which each represent a respective mechanical part.

20 Claims, 15 Drawing Sheets

(51) Int. Cl.
  *G06N 5/04* (2006.01)
  *G06F 30/27* (2020.01)
  *G06T 19/00* (2011.01)
  *G06T 17/00* (2006.01)
(58) Field of Classification Search
  USPC .................................................. 703/1
  See application file for complete search history.

(56) References Cited

U.S. PATENT DOCUMENTS

| | | | |
|---|---|---|---|
| 2017/0193699 A1* | 7/2017 | Mehr | G06T 17/205 |
| 2018/0068414 A1* | 3/2018 | Savvides | G06T 3/0093 |
| 2018/0120813 A1* | 5/2018 | Coffman | B33Y 50/00 |
| 2018/0260793 A1 | 9/2018 | Li et al. | |
| 2018/0314917 A1* | 11/2018 | Mehr | G06K 9/6274 |
| 2018/0341248 A1 | 11/2018 | Mehr et al. | |
| 2019/0005195 A1* | 1/2019 | Peterson | G16H 50/20 |
| 2019/0026917 A1* | 1/2019 | Liao | G06V 20/00 |
| 2019/0030371 A1* | 1/2019 | Han | G06V 30/194 |
| 2019/0050999 A1* | 2/2019 | Piat | G06K 9/6232 |
| 2019/0087544 A1* | 3/2019 | Peterson | G16H 50/20 |
| 2019/0147221 A1* | 5/2019 | Grabner | G06T 7/75 382/103 |
| 2019/0156206 A1* | 5/2019 | Graham | G06N 3/0454 |
| 2019/0291277 A1* | 9/2019 | Oleynik | B25J 9/1669 |
| 2020/0013232 A1* | 1/2020 | Kwai | G06T 13/40 |
| 2020/0210636 A1* | 7/2020 | Sanchez Bermudez | G06T 17/10 |
| 2020/0210814 A1* | 7/2020 | Mehr | G06N 3/088 |
| 2020/0210845 A1* | 7/2020 | Sanchez Bermudez | G06F 30/23 |
| 2020/0211678 A1* | 7/2020 | Foley | G16H 10/60 |
| 2020/0250540 A1* | 8/2020 | Mehr | G06N 3/0454 |
| 2020/0285907 A1* | 9/2020 | Mehr | G06V 20/653 |

OTHER PUBLICATIONS

Thibault Groueix, "A Papier-Mach • e Approach to Learning 3D Surface Generation," Jun. 2018, Proceedings of the IEEE Conference on Computer Vision and Pattern Recognition (CVPR), 2018,pp. 216-220.
Yaoqing Yang , "Folding Net: Point Cloud Auto-encoder via Deep Grid Deformation," Jun. 2018, Proceedings of the IEEE Conference on Computer Vision and Pattern Recognition (CVPR), 2018, ,pp. 206-210.
Zhirong Wu,"3D ShapeNets: A Deep Representation for Volumetric Shapes",Jun. 2015, Proceedings of the IEEE Conference on Computer Vision and Pattern Recognition (CVPR), 2015, pp. 1912-1918.
Fei-wei Qin,"A deep learning approach to the classification of 3D CAD models," Feb. 7, 2014, Journal of Zhejiang University Science C vol. 15, pp. 91-102.
Jonathan Dekhtiar,"Deep learning for big data applications in CAD and PLM—Research review, opportunities and case study," May 15, 2018, Computers in Industry 100 (2018) , pp. 228-235.
U.S. Non-Final Office Action dated Jan. 21, 2022 in corresponding U.S. Appl. No. 16/727,035, First Named Inventor: Eloi Mehr (25 pages).
European Office Action dated Aug. 3, 2021 in European Patent Application No. 18306882.4, 7 pages.
Angel X. Chang, et al., "ShapeNet: An Information-Rich 3D Model Repository," Retrieved from the Internet [URL: https://pdfs.semanticscholar.org/2327/c389267019508bbb15788b5caa7bdda30998.pdf], XP055461140, Dec. 9, 2015, 11 pages.
Notice of Allowance dated May 4, 2022, in co-pending U.S. Appl. No. 16/727,035 (15 pages).
Extended European Search Report dated Sep. 11, 2019 in European Patent Application No. 18306832.4-1221; (9 pages).
Maciej Zamorski, et al., "Adversarial Autoencoders for Generating 3D Point Clouds," arxiv. org, Cornell University Library, 201 Olin Library Cornell University, NY 14853, Nov. 19, 2018, XP081051923 (9 pages).
Shlorno E. Chazan, et al., "Deep Clustering Based on a Mixture of Autoencoders," arxiv. org, Cornell University Library, 201 Olin Library Cornell University, NY 14853, Dec. 16, 2018, XP080993631 (9 pages).
Extended European Search Report dated Nov. 5, 2019 in European Patent Application No. 18306833.2-1221; (10 pages).
Yoshua Bengio, "Learning Deep Architectures for AI", Foundations and Trends in Machine Learning, vol. 2. No. 1 (2009) (130 pages).
D.P. Bertsekas, "The Auction Algorithm: A Distributed Relaxation Method for the Assignment Problem", *Annals of Operations Research*, 14 (1998) 105-123.
Thibault Groueix, et al., "AtlasNet: A Papier-Mache Approach to Learning 3D Surface Generation", http://imagine.enpo.fr/~groueixt/atlasnet/, Jul. 20, 2018.
G.E. Hinton et al., "Reducing the Dimensionality of Data With Neutral Networks," *Science*, vol. 313, Jul. 28, 2006, pp. 504-507.
Christian Häne, et al., "Hierarchical Surface Prediction for 3D Object Reconstruction", University of California, Berkeley, malikg@eecs.berkeley.edu; Nov. 6, 2017, arXiv:1704.00710v2 [cs.CV]. (15 pages).
Charles R. Qi, et al., "PointNet: Deep Learning on Point Sets for 3D Classification and Segmentation", Stanford University, Apr. 10, 2017, arXiv:1612.00593v2 [cs.CV], (19 pages).
Charles R. Qi, et al., "PointNet++: Deep Hierarchical Feature Learning on Point Sets in a Metric Space", Stanford Unviersity, Jun. 7, 2017, arXiv:1706.02413v1 [cs.CV], (14 pages).
Maxim Tatarchenko, et al., "Multi-View 3D Models from Single images with a Convolutional Network", Department of Computer Science, University of Freiburg, Aug. 2, 2016; arXiv:1511.067702v2 [cs.CV]. (20 pages).
Pascal Vincent et al., "Stacked Denoising Autoencoders Learning Useful Representations in a Deep Network with a Local Criterion", Journal of Machine Learning Research, 11 (2010) 3371-3408.
Zhirong Wu et al., "3D Shape Nets: A Deep Representation for Volumetric Shapes", http://3dshapenets.cs_princeton.edu/. (9 pages).
Xinchen Yan at al., "Perspective Transformer Nets: Learning Single-View 3D Object Reconstruction without 3D Supervision". University of Michigan, Ann Arbor; Aug. 13, 2017. arXiv:1612.00814v3 [cs.CV]. (15 pages).
Yaoqing Yang et al., "FoldingNet: Point Cloud Auto-Encoder via Deep Grid Deformation", Carnegie Mellon University, Mitsubishi Electric Research Laboratories (MERL), Clemson University; Apr. 3, 2013, arXiv:1712.07262v2 [cs.CV]. (14 pages).

* cited by examiner

SET OF NEURAL NETWORKS

CROSS-REFERENCE TO RELATED APPLICATIONS

This application claims priority under 35 U.S.C. § 119 or 365 to European Application No. 18306883.2, filed Dec. 29, 2018. The entire contents of the above application(s) are incorporated herein by reference.

FIELD OF THE DISCLOSURE

The disclosure relates to the field of computer programs and systems, and more specifically to methods, systems and programs of machine-learning with a dataset including 3D modeled objects which each represent a respective mechanical part.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. It relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context and other contexts, machine-learning and especially autoencoders and/or manifold learning is gaining wide importance.

The following papers relate to this field and are referred to hereunder:

[1]: "Stacked Denoising Autoencoders: Learning Useful Representations in a Deep Network with a Local Denoising Criterion", P. Vincent, H. Larcohelle, I. Lajoie, Y. Bengio, P. Manzagol, in The Journal of Machine Learning Research, 2010.

[2]: "Reducing the Dimensionality of Data with Neural Networks", G. E. Hinton, R. R. Salakhutdinov, in Science, 2006.

[3]: "Learning Deep Architectures for AI", Y. Bengio, in Foundations and Trends in Machine Learning, 2009.

[4] Maxim Tatarchenko, Alexey Dosovitskiy, and Thomas Brox. Multi-view 3d models from single images with a convolutional network. In European Conference on Computer Vision, 2016.

[5] Xinchen Yan, Jimei Yang, Ersin Yumer, Yijie Guo, and Honglak Lee. Perspective transformer nets: Learning single-view 3d object reconstruction without 3d supervision. In Advances in Neural Information Processing Systems, 2016.

[6] Zhirong Wu, Shuran Song, Aditya Khosla, Fisher Yu, Linguang Zhang, Xiaoou Tang, and Jianxiong Xiao. 3d shapenets: A deep representation for volumetric shapes. In Computer Vision and Pattern Recognition, 2015.

[7] Christian Hine, Shubham Tulslani, and Jitendra Malik. Hierarchical surface prediction for 3d object reconstruction. In 3DV, 2017.

[8] Charles R Qi, Hao Su, Kaichun Mo, and Leonidas J Gulbas. Polntnet: Deep learning on point sets for 3d classification and segmentation. In Computer Vision and Pattern Regognition, 2017.

[9] Charles Ruizhongtai Qi, U Yi, Hao Su, and Leonidas J. Guibas. Pointnet++: Deep hierarchical feature learning on point sets in a metric space. In NIPS, 2017.

[10] Thibault Groueix, Matthew Fisher, Vladimir G. Kim, Bryan Russell, and Mathieu Aubry. AtlasNet: A PapierMBchd Approach to Learning 3D Surface Generation. In Computer Vision and Pattern Recognition, 2018.

[11] Yaoqing Yang Chen Feng, Yiru Shen, and Dong Tian. FoldingNet: Point Cloud Auto-encoder via Deep Grid Deformation. In Computer Vision and Pattern Recognition, 2018.

[12] Dimitri P. Bertsekas. The Auction Algorithm: a Distributed Relaxation Method for the Assignment. In Annals of Operations Research—Special Issue: Parallel Optimization on Novel Computer Architectures, Volume 14 Issue 1-4, June 1988.

Given a dataset representing samples from a same class, for instance a dataset of images of chairs, or a dataset of 3D models of cars, autoencoders (explained in earlier cited papers [1,2]) may be used to learn a mapping between the original input space of this dataset and a low-dimensional space, often called latent space. Moreover, autoencoders may also learn a reverse mapping from the latent space to the original input space. They may be used to extract meaningful features in the data, and/or compress the data into a compact representation.

Paper [4] learns a kind of autoencoder, where the input is an RGB image of the object and a viewpoint and predicts a depth map of the object in the input image at the given viewpoint, whereas paper [5] learns an autoencoder which transforms a single RGB image directly into a $32^3$ voxels grid representing the 3D object in the input.

Paper [6] learns a 3D convolutional deep belief network directly on $32^3$ voxels grids, representing a binary occupancy volume of the 3D shape. It is possible to reconstruct high-resolution voxels grids, using octrees, as done in paper [7].

Paper [8] and its multi-scale extension of paper [9] introduce a deep architecture able to directly learn on point clouds, called PointNet. If the point cloud is represented as a vector of n 3D points, the key is to build a network invariant to the permutation of the points, so that the network actually depends on the quotient of the space of the n 3D points by the action of permutations, i.e. is independent of the order we use to represent the point cloud. To achieve this goal, the architecture relies on shared layers applied to each input point, and of the form $g(h(x_1), \ldots, h(x_n))$, where h is a neural network from $\mathbb{R}^3$ to $\mathbb{R}^p$, and g is a permutation-invariant function such as the max function.

All these methods suffer from a lack of accuracy.

Within this context, there is still a need for improved methods of machine-learning with a dataset including 3D modeled objects which each represent a respective mechanical part.

SUMMARY OF THE INVENTION

It is therefore provided a computer-implemented method of machine-learning. The method comprises providing a dataset including 3D modeled objects which each represent a respective mechanical part. The method further comprises providing a set of neural networks. Each neural network has respective weights. Each neural network is configured for inference of 3D modeled objects. The method further comprises modifying respective weights of the neural networks by minimizing a loss. For each 3D modeled object of the dataset, the loss selects a term among a plurality of terms. Each term penalizes a disparity between the 3D modeled object and a respective 3D modeled object inferred by a respective neural network of the set. The selected term is a term among the plurality of terms for which the disparity is the least penalized.

This constitutes an improved method of machine-learning with a dataset including 3D modeled objects which each represent a respective mechanical part.

The method may comprise one or more of the following:
- the disparity between the 3D modeled object and the respective 3D modeled object inferred by the respective neural network of the set involves a distance between the 3D modeled object and the respective 3D modeled object inferred by the respective neural network of the set;
- the distance is a distance between a first point cloud representing the 3D modeled object and a second point cloud representing the respective 3D modeled object inferred by the respective neural network of the set;
- each neural network is configured for inference of deformations of a respective base template each into a respective 3D modeled object, each respective base template being a 3D modeled object;
- each respective base template is a 3D modeled object which represents a centroid of the 3D modeled objects of a sub-dataset of the dataset;
- the loss is of the type:

$$L_2(g_1 \circ f_1, \ldots, g_k \circ f_k) = \sum_{i=1}^{n} \min_{j=1,\ldots,k} D_2(S_j, x_i),$$

Where:
- $g_1 \circ f_1, \ldots, g_k \circ f_k$ is the set of neural networks;
- $x_1, x_2, \ldots, x_n$ are the 3D modeled objects of the dataset;
- $S_1, S_2, \ldots, S_k$ are the respective base templates; and
- $D_2(S_j, x_i)$ is a term involving a distance between a 3D modeled object $x_i$ and a deformation of a respective base template $S_j$ inferred by a respective neural network $g_j \circ f_j$;

the minimizing comprises iterations of:
- selecting a set of 3D modeled objects of the dataset;
- for each 3D modeled object of the selected set, assigning to the 3D modeled object a respective neural network by rewarding smallness of the disparity between the 3D modeled object and the respective 3D modeled object inferred by the respective neural network, each respective neural network being assigned to one or more 3D modeled objects of the selected set, weights of each respective neural network being modified as a result of the assigning; and/or
- each respective neural network is a respective autoencoder which comprises a respective decoder configured for the inference of the 3D modeled objects.

It is further provided a set of neural networks obtainable according to the method.

It is further provided a computer-implemented method of use of the set of neural networks.

The method of use may comprise one or more of the following:
- each neural network is a respective autoencoder which comprises a respective decoder configured for the inference of the 3D modeled objects, the method comprising:
  - providing two or more 3D modeled objects;
  - projecting the two or more 3D modeled objects each on a latent space of a respective autoencoder of the set of neural networks;
  - computing one or more interpolations, on the latent space, between the projected two or more 3D modeled objects; and
  - applying the decoder to each computed interpolation;
- each neural network is a respective autoencoder which comprises a respective decoder configured for the inference of the 3D modeled objects, the method comprising:
  - providing a part of a 3D modeled object;
  - applying a respective autoencoder to the part of the 3D modeled object; and
  - fitting, to the part of the 3D modeled object, the result of the applying of the respective autoencoder to the part of the 3D modeled object; and/or
- each neural network is a respective autoencoder which comprises a respective decoder configured for the inference of the 3D modeled objects, the method comprising:
  - providing a 3D modeled object;
  - applying one or more respective autoencoders to the 3D modeled object; and
  - selecting a respective autoencoder based on the applying.

It is further provided a computer program comprising instructions for performing the method and/or the method of use.

It is further provided a device comprising a data storage medium having recorded thereon the set of two or more respective neural networks and/or the computer program.

The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g. the device is a subsystem of the overall system). The system may further comprise a graphical user interface coupled to the processor.

BRIEF DESCRIPTION OF THE DRAWINGS

Embodiments will now be described, by way of non-limiting example, and in reference to the accompanying drawings, where.

DETAILED DESCRIPTION

Figure 1:
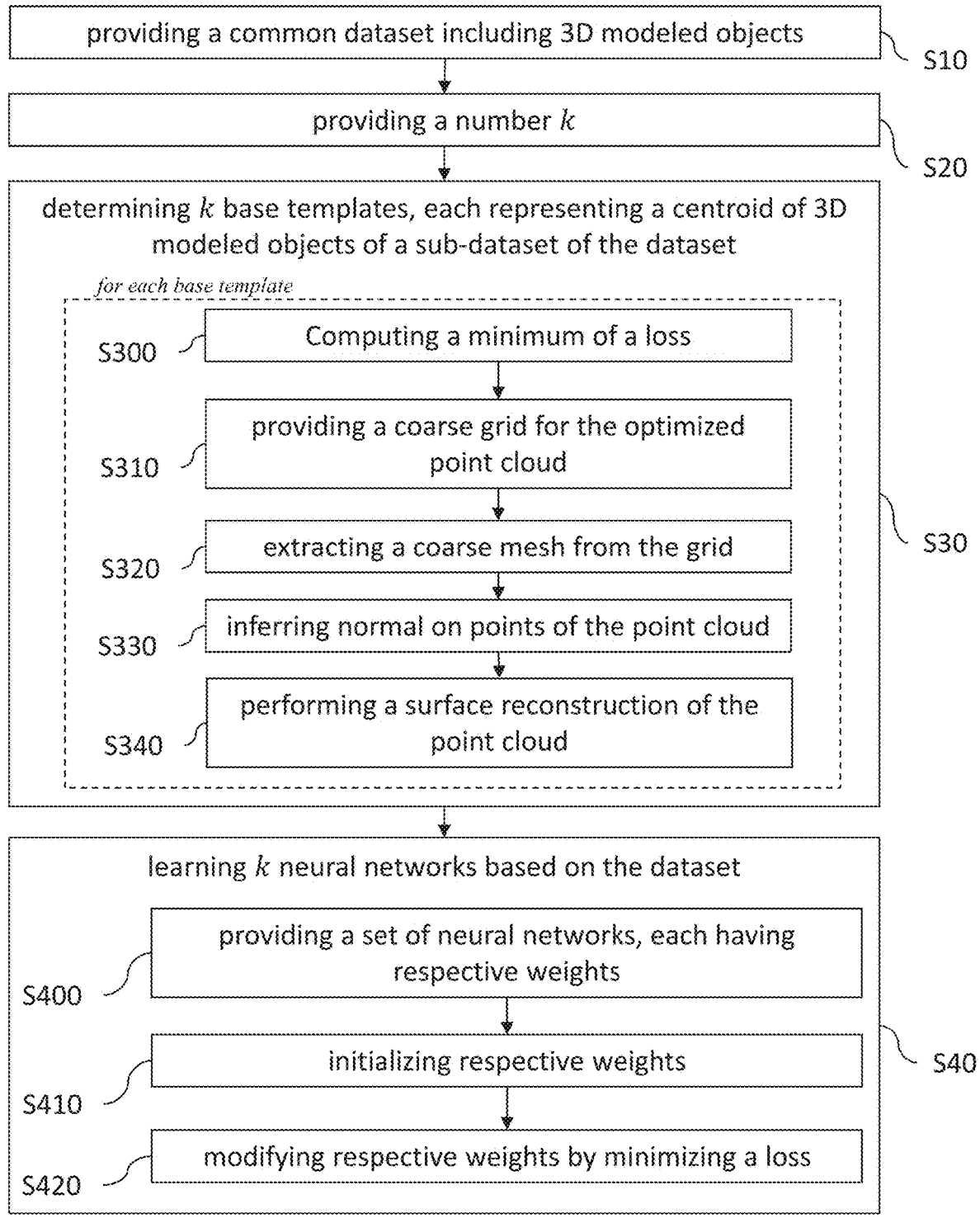
FIG. 1 shows a flowchart of an example computer-implemented process integrating an example of the method.

It is provided computer-implemented methods of machine-learning with a dataset including 3D modeled objects which each represent a respective mechanical part.

It is notably provided a first computer-implemented method of machine-learning. The first method comprises providing a dataset including 3D modeled objects. The 3D modeled objects each represent a respective mechanical part. The dataset has one or more sub-datasets. Each sub-dataset forms at least a part of the dataset. The first method further comprises, for each respective sub-dataset, determining a base template. The base template is a 3D modeled object which represents a centroid of the 3D modeled objects of the sub-dataset. The first method further comprises learning a neural network configured for inference of deformations of the base template each into a respective 3D modeled object. The learning comprises a training based on the sub-dataset. This first method may be referred to as "template-learning method" in the following.

The template-learning method forms an improved method of machine-learning with a dataset including 3D modeled objects which each represent a respective mechanical part.

Notably, the template-learning method allows determining of, for each respective sub-dataset, a 3D modeled object that represents a centroid of 3D modeled objects of the sub-dataset. In other words, the template-learning method determines a 3D modeled object, namely the base template, which represents (e.g. a mean shape of) the 3D modeled objects of the sub-dataset. The template-learning method further allows learning of a neural network which infers deformations of the centroid each into a respective 3D modeled object. The learning of such a neural network comprises a training based on the sub-dataset. In other words, the learning uses 3D modeled objects of the sub-dataset to learn the inference of deformations of a centroid of such modeled objects. The learning may thus focus on learning the inference of accurate details of the deformations, because the base template, being a centroid of the sub-dataset, needs not being deformed much and/or roughly to be transformed into a 3D modeled object of the sub-dataset. Hence, a neural network learnt according to the template-learning method infers accurate deformations of the base template into 3D modeled objects of the dataset. In examples, the neural network is an autoencoder comprising a decoder configured for the inference of the deformations. In such examples, the autoencoder may take as input a 3D modeled object and may output a reconstruction of the 3D modeled object, the reconstruction being or being based on a deformation, inferred by the decoder, of the base template into the 3D modeled object. Since the decoder infers accurate deformations of the base template into 3D modeled objects of the sub-dataset, the reconstruction of such objects by the autoencoder is accurate.

In examples, the dataset is partitioned or substantially partitioned by k respective sub-datasets, the number k being for example larger than two. In these examples, the template-learning method determines k base templates and learns k neural networks. Each base template represents a centroid of a respective sub-dataset. In these examples, each neural network learnt by the template-learning method infers deformations of a respective one of the k base templates into 3D modeled objects. Thus, as previously explained, each neural network infers accurate deformations of the respective one of the k base templates into 3D modeled objects of a respective sub-dataset (the one of which the respective one of the k base templates represents a centroid). In other words, the template-learning method learns k neural networks which are each specialized in inferring accurate deformations of the centroid of a respective sub-dataset into objects of the sub-dataset. In examples, the template-learning method may thus learn k autoencoders each respectively specialized in reconstructing 3D modeled objects of a respective sub-dataset.

It is to be understood that the number k may be equal to one, in which case the dataset comprises only one sub-dataset. The sub-dataset forms at least a part, which in this case means that the sub-dataset is equal or substantially equal to the dataset. In such examples, the template-learning method still beneficiates from the previously discussed accuracy of learning a neural network configured for inference of deformations of the determined base template. Indeed, the determined base template represents a centroid of all or substantially all the 3D modeled objects of the dataset, and, thus, during its learning, the neural network configured for inference of deformations of the determined base template may focus on learning accurate details of the deformations.

The number k may correspond to the fact that the dataset is per se partitioned or substantially partitioned into k respective classes of 3D modeled objects. That is, each respective sub-dataset is made, uniquely or substantially uniquely, of 3D modeled objects of one respective class. By "the dataset is partitioned per se by k respective sub-datasets each made of 3D modeled objects of a respective class", it is meant in examples that the template-learning method comprises, before the determining of base templates and/or before the learning of neural networks, a step of partitioning the dataset by k respective sub-datasets each made of 3D modeled objects of a respective class. The partitioning may comprise assigning, to each 3D modeled object of the dataset, a label representative of a respective class. In such cases, the template-learning method thus provides k neural networks, each being specialized in inferring accurate deformations of the centroid of a respective sub-dataset into objects of the class corresponding to the sub-dataset. In examples, the template-learning method may thus learn k autoencoders each respectively specialized in reconstructing 3D modeled objects of a respective class.

Additionally or alternatively, the number k may be provided by a user. In such examples, the dataset is not necessarily per se partitioned or substantially partitioned into k respective sub-datasets each made of 3D modeled objects of a respective class, but the providing of the number k may however enforce such a partition. By "enforce", it is meant that the partition may result from (and/or occur during) the determining of base templates and/or the learning of neural networks, e.g. without user action. Indeed, the determining of the k base templates may comprise minimizing a common loss. For each 3D modeled object of the dataset, the common loss selects a term among a plurality of terms. Each term penalizes a disparity between the 3D modeled object and a candidate base template. The selected term may be a term among the plurality of terms for which the disparity is the least penalized. In other words, the determining operates (e.g. iteratively) a selection of candidate base templates (which are 3D modeled objects tested as potential base templates) according to their similarity to 3D modeled objects of the dataset. This enforces the determination of k respective base templates whose average dissimilarity to all the 3D modeled objects of a respective sub-dataset is minimal. In other words, the template-learning method enforces the partitioning of the dataset into k sub-datasets by enforcing the determination of k centroids, thereby clustering the objects of the dataset each according to their (e.g. best) similarity to one of the centroids. In other words, the providing of the number k automatically partitions the dataset into k respective classes, each class corresponding to the objects of a respective one of the k sub-datasets that is objects of which dissimilarities to the centroid of the sub-dataset are minimal. Such a partitioning also forces each learnt neural network of the k learnt neural networks to be specialized in inferring accurate deformations of the centroid of a respective sub-dataset into objects of the class corresponding to the sub-dataset. In examples where the dataset is per se partitioned or substantially partitioned into k respective classes of 3D modeled objects, the previously-discussed partitioning of the dataset subsequent to the providing of the number k may in fact correspond or substantially correspond to the per se partitioning of the dataset. In other words, the previously-discussed partitioning of the dataset subsequent to the providing of the number k may lead to the same result (i.e. the same partition of the dataset) than the per se partitioning of the dataset.

In examples, there is only one sub-dataset (e.g. the only one sub-dataset forming the whole dataset) and thus only one template representing a centroid of the whole dataset is determined. In other examples, there are several sub-datasets, and thus one centroid is determined per sub-dataset. In particular examples of such examples, the dataset is provided raw (i.e. with no information regarding to which sub-dataset elements of the dataset belong), and the learning comprises minimizing a single loss (i.e. and no other loss). In such particular examples, the loss is configured for operating assignment of elements to correct respective sub-datasets. In such examples, the learning of several base templates may allow avoiding the requirement to have separated the dataset into several sub-dataset in advance. In such examples, the single loss may which make it possible to automatically cluster the dataset step-by-step during the learning of base templates (similarly to the learning of several autoencoders).

It is also provided a second computer-implemented method of machine-learning. The second method comprises providing a dataset including 3D modeled objects. The 3D modeled objects each represent a respective mechanical part. The second method comprises providing a set of neural networks. Each neural network has respective weights Each neural network is configured for inference of 3D modeled objects. The second method further comprises modifying respective weights of the neural networks by minimizing a loss. For each 3D modeled object of the dataset, the loss selects a term among a plurality of terms. Each term penalizes a disparity between the 3D modeled object and a respective 3D modeled object inferred by a respective neural network of the set. The selected term is a term among the plurality of terms for which the disparity is the least penalized This second method may be referred to as "manifold-learning method" in the following.

The manifold-learning method forms an improved method of machine-learning with a dataset including 3D modeled objects which each represent a respective mechanical part.

Notably, the manifold-learning method learns several neural networks on a same dataset of 3D modeled objects, each neural network inferring 3D modeled objects. The learning includes the minimizing of a loss, and the loss operates a selection among terms penalizing disparities between 3D modeled objects of the dataset and 3D modeled objects inferred by respective neural networks. The selected term is a term for which disparity is the least penalized. In other words, the manifold-learning method learns the neural networks by (e.g. iteratively) operating, for each 3D modeled object of the dataset, a selection of which neural network infers (e.g. the most) accurately the 3D modeled object. As a result, each neural network is (e.g. iteratively, e.g. progressively during its learning) specialized in inferring 3D modeled objects of a sub-dataset of the dataset, each sub-dataset being made of 3D modeled objects of the dataset into which the neural network is specialized. The neural networks learnt by the manifold-learning method are thus accurate. In examples, the neural networks are each an autoencoder comprising a decoder configured for the inference of the 3D modeled objects. In such examples, each autoencoder may take as input a 3D modeled object and may output a reconstruction of the 3D modeled object, the reconstruction being or being based on the 3D modeled object inferred by the decoder. Since each decoder infers accurately the 3D modeled objects of a sub-dataset of the dataset, the reconstruction of such objects by the autoencoder is thus accurate.

In examples, the manifold-learning method learns k neural networks. That is, the set of neural networks is made of k neural networks. The number k may be provided by a user. Such a providing of the number k then enforces the above-discussed specialization of each neural network in the inference of 3D modeled objects of a respective one of k sub-datasets of the dataset. Such a providing of the number k also enforces the partitioning (e.g. during the learning, e.g. without user actions) of the dataset into k classes of 3D modeled objects, each class corresponding to the 3D modeled objects of which inference is the specialty of a respective one of the learnt k neural networks. In examples, such a forced partitioning of the dataset into k classes of 3D modeled objects may correspond to a per se partition or substantial partition of the dataset into k classes of 3D modeled objects, where each respective sub-dataset is made, uniquely or substantially uniquely, of 3D modeled objects of one respective class. By "a per se partition of the dataset into k classes of 3D modeled objects", it is further meant in examples that the manifold-learning method comprises, before the learning of neural networks, a step of partitioning the dataset by k respective sub-datasets each made of 3D modeled objects of a respective class. The partitioning may comprise assigning, to each 3D modeled object of the dataset, a label representative of a respective class.

In examples, each neural network is configured for inference of deformations of a respective base template each into a respective 3D modeled object. In these examples, each respective base template is a 3D modeled object. In these examples, each respective base template may be a 3D modeled object which represents a centroid of the 3D modeled objects of a sub-dataset of the dataset. In such examples, each neural network is particularly accurate. First, because it is specialized in inferring 3D modeled objects of a sub-dataset, which makes it accurate, as previously discussed. Second, because the 3D modeled objects inferred by the neural network are or are based on deformations of a 3D modeled object (the centroid) to which they are similar, which makes the neural network accurate, as previously discussed. In examples, the respective base templates or at least a part of them are determined according to the template-learning method. In such cases, the learnt neural networks benefit from the previously discussed accuracies of both the template-learning method and the manifold-learning method, which makes them particularly accurate. Alternatively, the respective base templates or at least a part of them may be determined by any other method.

The template-learning method and the manifold-learning method may be performed independently. The learning of one or more neural networks according to the template-learning method (that is, the learning of a neural network for each respective one of the one or more sub-datasets) may comprise the minimizing of the loss according to the manifold-learning method. Alternatively, the learning of one or more neural networks according to the template-learning method may be performed by any other machine-learning method. The neural networks learned by the manifold-learning may be configured for inference of deformations of base templates, the base templates being determined by the template-learning method or by any other method, as previously discussed.

The template-learning method and the manifold-learning method may be integrated to a same process. FIG. 1 shows a flowchart illustrating the process, which is now discussed.

The process comprises providing S10 a common dataset including 3D modeled objects. Each 3D modeled object represents a respective mechanical part. In examples, the providing of a dataset according to the template-learning method and the providing of a dataset according to the manifold-learning method consist in reusing the provided S10 common dataset according to the process. In other words, the dataset provided by the template learning method and the dataset provided by the manifold-learning method are both identical to the common dataset provided by the process. Alternatively, the providing of the dataset according to the template-learning method may consist in reusing a first part of the common dataset and the providing of the dataset according to the manifold-learning method may consist in reusing a second part of the common dataset. The second part and the first part may be different. In examples, the second part and the first part may be different but may comprise 3D modeled objects of the same classes. In other words, both the second part and the first part may be per se partitioned by a same number k of classes of 3D modeled objects. The process further comprises providing S20 a number k. The providing S20 of the number k may comprise specifying (e.g. declaring), by a user, the number k. The process further comprises determining S30 k base templates. The determining S30 of the k base templates is performed according to the template-learning method. The process further comprises learning S40 k neural networks. The learning S40 of the k neural networks comprises the modifying S420, according to the manifold-learning method, of the respective weights of the set of neural networks made of the k neural networks.

Using in the process the same dataset (namely, the common dataset) to carry out the determining S30 of k base templates according to the template-learning method and the learning of k neural networks according to the manifold-learning method allows to particularly beneficiate from the combination of these two methods. Indeed, the determining S30 of the k base templates according to the template-learning method partitions (e.g. clusters) the common dataset into k sub-datasets, which in other words also partitions the common dataset into k classes of 3D modeled objects. Each respective one of the k neural networks learnt according to the manifold-learning method may be learnt to be configured for inference of deformations of a respective one of the k base templates into 3D modeled objects of the common dataset. In such cases, the partitioning of the common dataset into k sub-datasets, provided by the determining S30 of the k base templates, facilitates and improves the previously-discussed specialization of each respective one of the k neural networks into the inference of accurate deformation of the centroid of a respective one of the k sub-datasets into 3D modeled objects of the sub-dataset. Furthermore, each respective one of the k neural networks can focus on learning S40 the details on the deformations of a centroid of a sub-dataset into 3D modeled objects of the sub-dataset, which improves its accuracy, as previously discussed. In examples, the process may thus learn k autoencoders each particularly specialized into reconstructing particularly accurately 3D modeled objects of a respective sub-dataset.

Additionally or alternatively, the provided number k may correspond to the fact that the common dataset is per se partitioned or substantially partitioned into k classes of 3D modeled objects, as previously discussed. In such cases, the process may thus provide k neural networks specialized into inference of deformations of respective centroids of k respective sub-datasets each made of objects of one class into 3D modeled objects of the class. Notably, the process may thus learn k autoencoders each particularly specialized into reconstructing particularly accurately 3D modeled objects of a respective class.

It is further proposed a neural network and/or a set of (e.g. k) neural networks learnable and/or obtainable according to the template-learning method, the manifold learning method, or the process. It is also provided a computer-implemented method of use of the neural network and/or of the set of (e.g. k) neural networks. Examples of the method of use are now discussed.

Examples of the method of use of the neural network are now discussed.

In these examples, the neural network is an autoencoder which comprises a decoder configured for the inference of the deformations of a base template each into respective 3D modeled objects. In these examples, the method of use further comprises providing a first 3D modeled object and a second 3D modeled object. In these examples, the method of use further comprises applying the autoencoder to the first 3D modeled object and to the second 3D modeled object. In these examples, the method of use further comprises determining a shape matching between the first 3D modeled object and the second 3D modeled object, based on the result of the applying of the autoencoder.

The base template may represent a centroid of the 3D modeled objects of a class of 3D modeled objects. In examples, each 3D modeled object of the class and the base template are 3D meshes (or point clouds). In these examples, the decoder may be configured for inferring a set of correspondences between each vertex (or point) of the base template and vertex (or point) of the 3D modeled object of the class into which the base template is deformed. The 3D modeled object and the second 3D modeled object may be both modeled objects of the class. Thus, in examples, the applying of the autoencoder outputs a first set of correspondences between each vertex (or point) of the base template and each vertex (or point) of the first 3D modeled object. In these examples, the applying of the autoencoder further outputs a second set of correspondences between each vertex (or point) of the base template and each vertex (or point) of the second 3D modeled object. Based on the first set of correspondences and the second set of correspondences, a third set of correspondences between each vertex (or point) of the first 3D modeled object and each vertex (or point) of the second 3D modeled object may be inferred. In examples, determining the shape matching corresponds to the inference of the third set of correspondences.

Learning a base template ensures a better topology consistency for the autoencoder. Especially, starting from a learnt base template ensures a correspondence vertex-to-vertex between all the meshes or point clouds reconstructed by the autoencoder, allowing the shape matching provided by the method of use, as previously discussed. Two applications of shape matching are now discussed.

The first application is Shape Matching for Simulation. The first application comprises providing a first 3D modeled object and one or more second 3D modeled objects, e.g. the first 3D modeled object and the one or more second 3D modeled objects all belonging to a same class of 3D modeled objects. For each second 3D modeled object, the first application comprises applying the autoencoder to the first 3D modeled object and to the second 3D modeled object, according to the method of use. The first application further comprises determining a shape matching between the first 3D modeled object and the second 3D modeled object based on the result of the applying of the autoencoder, according to the method of use. The first application further comprises annotating the first 3D modeled object with one or more publications and/or landmarks for a simulation experience and retargeting one of more of the annotations on each second 3D modeled object by using each determined shape matching. The first application further comprises re-running the simulation experience for each annotated second 3D modeled object, thereby allowing to re-run the simulation for any second 3D modeled object by only annotating the first 3D modeled object.

The second application is Shape Matching for Material/Texture Retargeting. The second application comprises providing a first 3D modeled object and one or more second 3D modeled objects, e.g. the first 3D modeled object and the one or more second 3D modeled objects all belonging to a same class of 3D modeled objects. For each second 3D modeled object, the second application comprises applying the autoencoder to the first 3D modeled object and to the second 3D modeled object, according to the method of use. The second application further comprises determining a shape matching between the first 3D modeled object and the second 3D modeled object based on the result of the applying of the autoencoder, according to the method of use. The second application further comprises applying a texture or material with UV mapping on the first modeled object. The second application further comprises retargeting the UV mapping on the one or more second modeled objects by using each determined shape matching. This allows retargeting of the UV mapping on any other second 3D modeled object and so retargeting of the texture or material.

Retargeting is easier by way of the reconstruction provided by the autoencoder because precisely the autoencoder may always have the same mesh topology with the same output connectivity.

Figure 2:
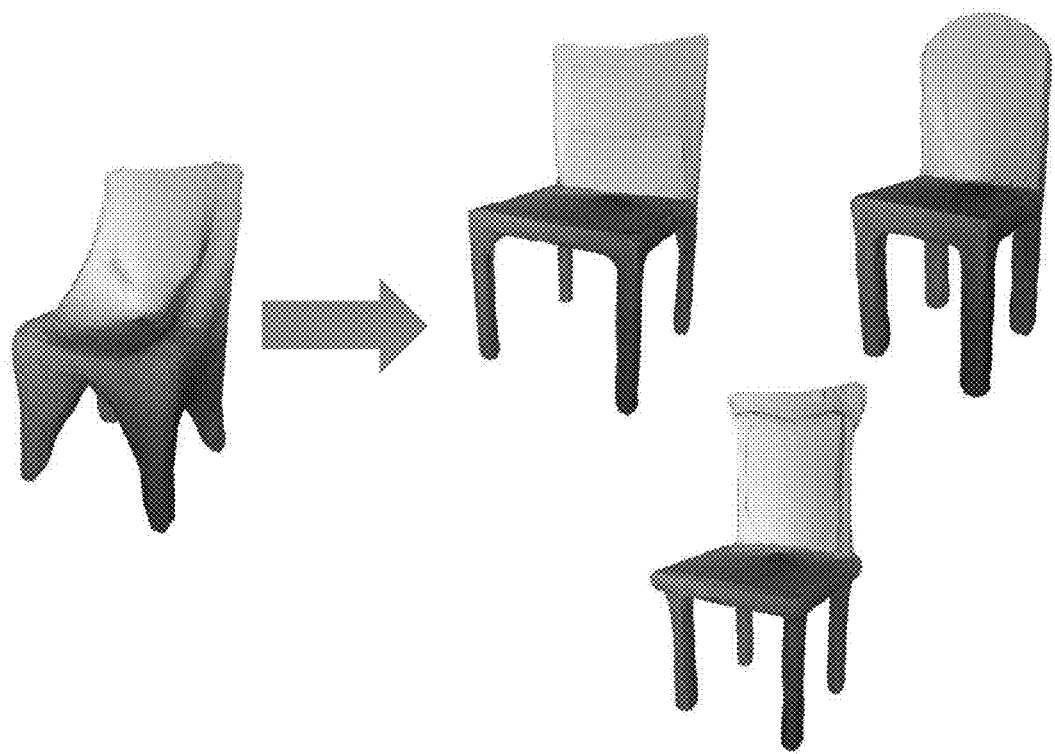
FIGS. 2, 3, 4, 5, 6, 7, 8, 9, 10, 11, 12, 13, 14, 15A-15B, 16, 17, 18, 19 illustrate the method and/or the process and/or the method of use.

An example of an application of the shape matching determined by the above-discussed examples of the method of use is illustrated by FIG. 2, where it is shown that the autoencoder preserves the connectivity and allows putting in correspondence the vertices of the chairs.

Examples of the method of use of the set of (e.g. k) neural networks are now discussed.

In these examples, each neural network is a respective autoencoder which comprises a respective decoder configured for the inference of 3D modeled objects. In these examples, the method of use comprises providing two or more 3D modeled objects. In these examples, the method of use further comprises projecting the two or more 3D modeled objects each on a latent space of a respective autoencoder of the set of neural networks. In these examples, the method of use further comprises computing one or more interpolations, on the latent space, between the projected two or more 3D modeled objects. In these examples, the method of use further comprises applying the decoder to each computed interpolation.

Any computed interpolation of the one or more interpolations computed on the latent space is a latent vector (also referred to as "an interpolated latent vector") which is an interpolation between two latent vectors, the two latent vectors being the respective projections, on the latent space, of 3D modeled objects of the two or more 3D modeled objects. The method of use thus computes one or more such interpolated latent vectors. The interpolation between two latent vectors may be any interpolation, such as any linear interpolation on a vector space.

In examples, each 3D modeled object involved in the method of use is a 3D modeled object of a class. In such cases, the decoder of the respective autoencoder may be configured for (e.g. specialized into) inference of 3D modeled objects of the class. Applying the decoder to a computed interpolation thus outputs a 3D modeled object of the class. Because the computed interpolation is an interpolated latent vector computed between two projections of two 3D modeled objects of the class, the decoded interpolated latent vector is a 3D modeled object of the class representing an interpolation, such as an intermediate geometrical shape, between said two 3D modeled objects of the class. The method of use may thus compute one or more such interpolations.

Examples of the method of use are now discussed with reference to FIG. 3 and FIG. 4.

Figure 3:
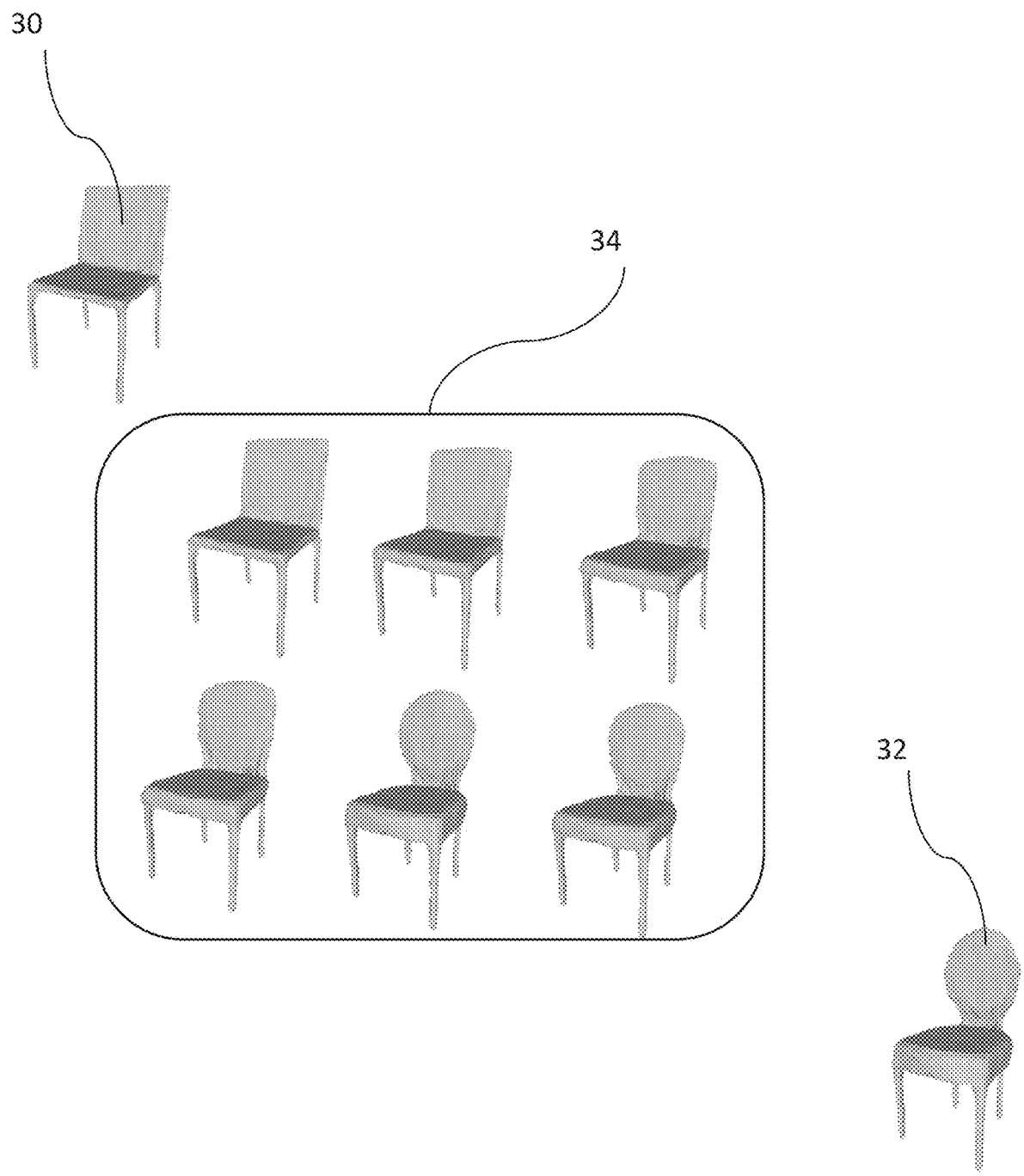

FIG. 3 shows a first 3D modeled object 30 and a second 3D modeled object 32. Both objects are chairs belonging to the class of chairs with four legs. FIG. 3 shows a set 34 of six chairs with four legs, each one belonging to the class, each one being an interpolation between the two chairs 30 and 32 computed according to the method of use.

Figure 4:
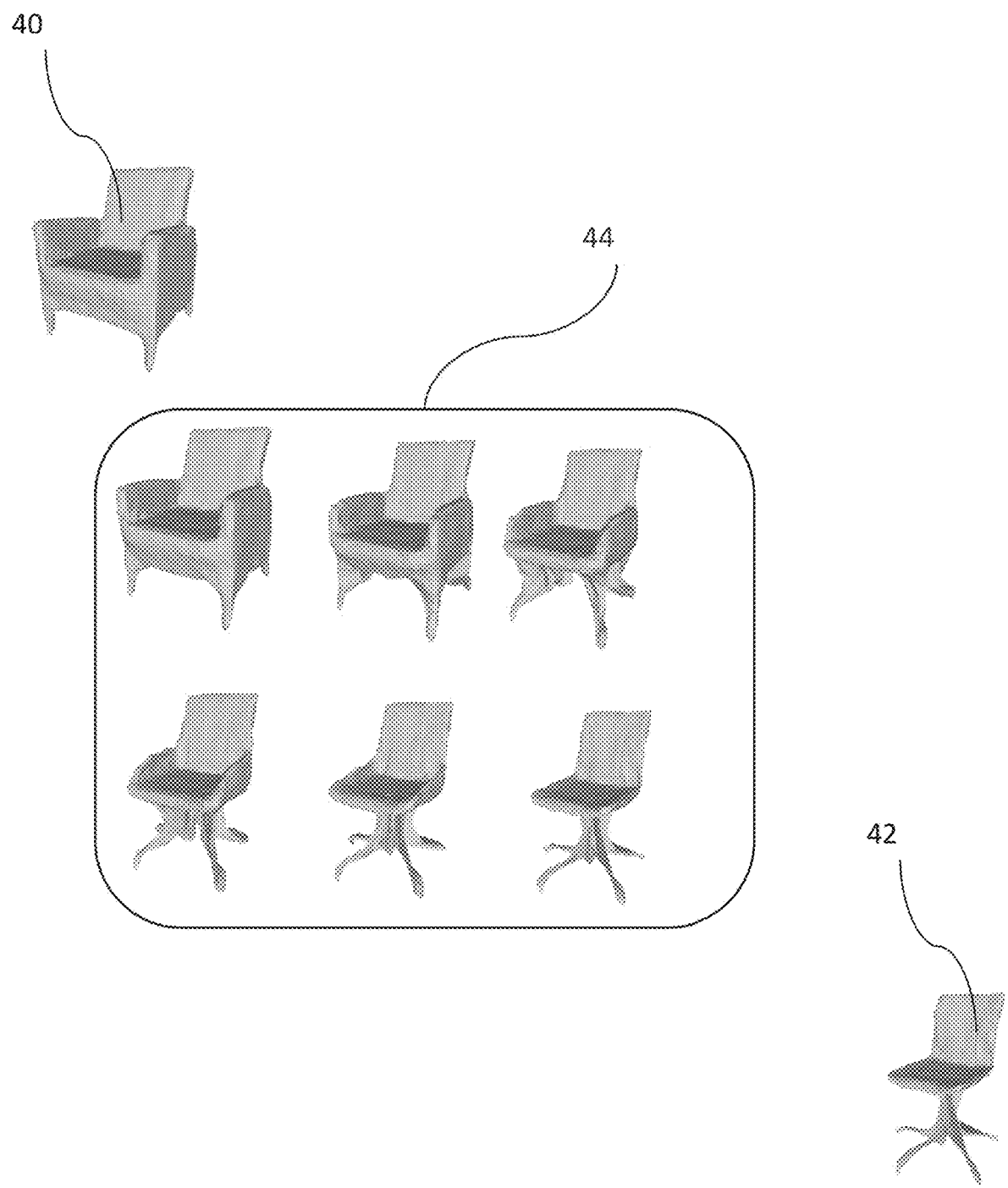

FIG. 4 shows a first 3D modeled object 40 and a second 3D modeled object 42. Both objects are chairs belonging to the class of chairs. FIG. 4 shows a set 44 of six chairs, each one belonging to the class, each one being an interpolation between the two chairs 40 and 42 computed according to the method of use.

Beneficiating from the previously-discussed accuracy of the template-learning method, of the manifold-learning method, or of the process, the method of use thus allows performing of realistic non-linear interpolations in the original input spaces of each autoencoder.

Other examples of the method of use of the set of (e.g. k) neural networks are now discussed.

In these examples of the method of use, each neural network is a respective autoencoder which comprises a respective decoder configured for the inference of the 3D modeled objects. In these examples, the method of use comprises providing a part of a 3D modeled object. In these examples, the method of use comprises applying a respective autoencoder to the part of the 3D modeled object. In these examples, the method of use further comprises fitting, to the part of the 3D modeled object, the result of the applying of the respective autoencoder to the part of the 3D modeled object.

The decoder may be configured for inference of 3D modeled objects of a class of 3D modeled objects. The 3D modeled object may belong to the class. Applying the autoencoder to the part of the 3D modeled object may thus output another 3D modeled object of the class. Fitting, to the part of the 3D modeled object, the result of the applying of the respective autoencoder to the part of the 3D modeled object may thus consist in deforming the another 3D modeled object of the class so that a part of the another 3D modeled object of the class matches (e.g. geometrically) the part of the 3D modeled object, thereby resulting in an autocompletion of the 3D modeled object.

Figure 5:
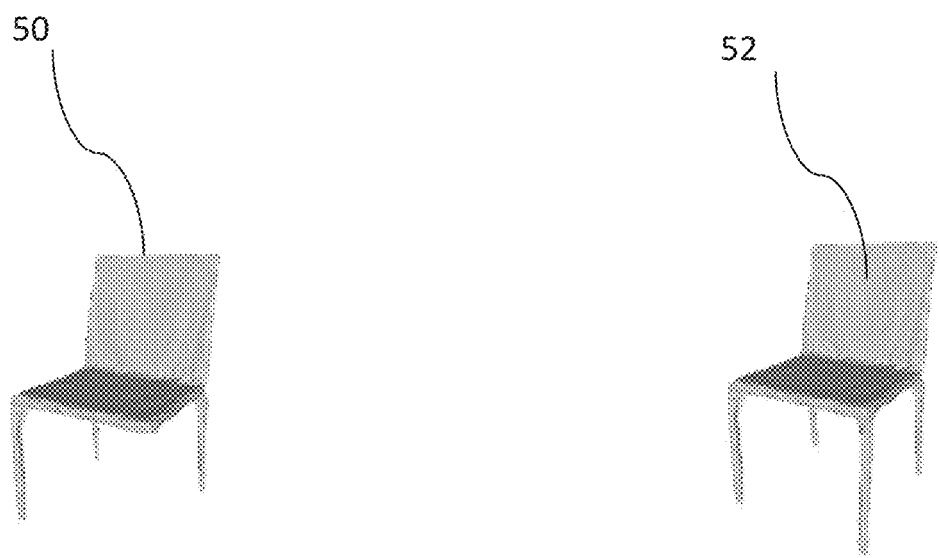

An example of such a method of use is now discussed with reference to FIG. 5. FIG. 5 shows an example of the part 50 of the 3D modeled object, which is a chair with a missing leg. FIG. 5 further shows the result 52 of the applying of the respective autoencoder to the part 50 of the 3D modeled object, once fitted to the part 50 of the 3D modeled object. The fitted result 52 is the chair 50 with no missing leg.

The method of use may thus be applied in a Shape inference process for Scans Autocompletion in a 3D scan pipeline. Such a pipeline is now discussed.

The 3D scan pipeline may comprise scanning one or more real objects, e.g. objects of a 3D scene of the real world. The scanning may comprise providing one or more physical sensors each configured for acquiring a respective physical signal and acquiring one or more respective physical signals by operating the one or more physical sensors on the one or more real objects (i.e. scanning, e.g. one after the other or simultaneously, the one or more real objects with each sensor). The 3D scan pipeline may them comprise applying a 3D reconstruction method which automatically determines, for each scanned real world object and based on measurements of the one or more physical sensors, a 30 point cloud and/or a 3D mesh representing the scanned real world object. The 3D reconstruction may be carried out according to any known technique. The one or more sensors may comprise a plurality of (e.g. RGB, and/or image or video) cameras and the determination may comprise a structure-from-motion analysis. The one or more sensors may alternatively or additionally comprise one or more depth sensors (e.g. on an RGB-depth camera) and the determination may comprise a 3D reconstruction from depth data. The one or more depth sensors may for example comprise a laser (e.g. a lidar) or an ultrasound emitter-receiver.

One or more scanned real world object may feature each at least one occlusion. Such an object may be represented by a partial point cloud (that is, a part of the complete point cloud supposed to represent the full real object, without occlusions). The 3D scan pipeline may then comprise applying the method of use to each one of the one or more partial point cloud representing the one or more scanned real-world object featuring occlusions, so as to autocomplete each partial point cloud. Specifically, for each partial point cloud, the part of the 3D modeled object provided according the method of use is the partial point cloud. According to the method of use, a respective autoencoder is applied to the partial point cloud and the result of applying the respective autoencoder is fitted to the partial point cloud, thereby autocompleting the partial point cloud. It is to be understood that, in examples, to carry out the autocompleting, one cannot simply give the partial point cloud as is to autoencode. In these examples, one may rather learn another encoder that predicts the latent vector of the 3D shape from an incomplete cloud or optimize in the latent space the 3D shape that best fits the partial point cloud.

For each respective one of said partial point clouds, when the point cloud represents an object belonging to a class of 3D modeled objects, the method of use may thus allow applying of an autoencoder of which decoder is configured for inference of 3D modeled objects of the class. As a result, the autocompletion for such an object is accurate, since it beneficiates from the previously discussed specialization of the decoder into the inference of 3D modeled objects of the class. Using several autoencoders according to the method of use, each autoencoder having a respective decoder specialized in inference of 3D modeled objects of a respective class, thus greatly improves the accuracy of the autocompletion.

Other examples of the method of use of the set of (e.g. k) neural networks are now discussed.

In these examples of the method of use, each neural network is a respective autoencoder which comprises a respective decoder configured for the inference of the 3D modeled objects. In these examples, the method of use further comprises providing a 3D modeled object. In these examples, the method of use further comprises applying one or more respective autoencoders to the 3D modeled object. In these examples, the method of use further comprises selecting a respective autoencoder based on the applying.

Selecting the autoencoder may consist in selecting the autoencoder which is reconstructs the best the provided 3D modeled object. Thus, the method of use may be used in a clustering process. Specifically, each respective decoder may be specialized into inference of 3D modeled objects of a respective class of a dataset of 3D modeled objects, the dataset being for example partitioned by the respective classes. The clustering process may comprise providing another dataset of 3D modeled objects. The clustering process may also comprise applying the method of use to each 3D modeled object of the another dataset. As a result, for each 3D modeled object of the another dataset, the clustering process determines which autoencoder reconstructs the best the 3D modeled object. The clustering process may then assign the 3D modeled object to the class into which the decoder of the autoencoder is specialized. In other words, one may obtain an automatic clustering algorithm by iterating the method of use.

The template-learning method, the manifold-learning method, and the process are computer implemented. The notion of computer-implemented method (resp. process) is now discussed.

By "a method (resp. process) is computer-implemented", it is meant that steps (or substantially all the steps) of the method (resp. process) are executed by at least one computer, or any system alike. Thus, steps of the method (resp. process) are performed by the computer, possibly fully automatically, or, semi-automatically. In examples, the triggering of at least some of the steps of the method (resp. process) may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method (resp. process) is to perform the method (resp. process) with a system adapted for this purpose. The system may comprise a processor coupled to a memory and a graphical user interface (GUI), the memory having recorded thereon a computer program comprising instructions for performing the method/process. The memory may also store a database. The memory is any hardware adapted for such storage, possibly comprising several physical distinct parts (e.g. one for the program, and possibly one for the database).

In examples of the process, the determining S30 of k base templates according to the template-learning method and the learning S40 of k neural networks according to the manifold-learning method may be performed by the same computer or by the same set of computers. In these examples, steps of the process which are performed through user-interaction, such as for example the providing S20 of a number k, may be triggered by the same user. Alternatively, the process may be performed by different computers and/or users. For example, the determining S30 of k base templates according to the template-learning method may be performed by a first set of one or more computers, possibly involving human-machine interactions with a first user, and the learning S40 of k neural networks according to the manifold-learning method may be performed by a second set of one or more computers, possibly involving human-machine interactions with a second user. The first and second set of one or more computers may be connected by a network.

The concept of providing a dataset including 3D modeled objects, involved in the template-learning method, the manifold-learning method, and the process, will be discussed. Prior to the discussion of this concept, data structures involved therein are now discussed. As will be recognized, the data structure definitions and examples provided herein may apply to at least part (e.g. all) of the dataset provided by the template-learning method, the manifold-learning method and/or the process.

A discrete geometrical representation of a 3D shape is herein a data structure which comprises a discrete set of pieces of data. Each piece of data represents a respective geometrical entity positioned in a 3D space. Each geometrical entity represents a respective location of the 3D shape (in other words, a respective portion of material constitutive of a solid represented by the 3D shape). The aggregation (i.e. union or juxtaposition) of the geometrical entities represents altogether the 3D shape. Any discrete geometrical representation herein may in examples comprise a number of such pieces of data higher than 100, 1000, or 10000.

Any discrete geometrical representation herein may for example be a 3D point cloud, each geometrical entity being a point. Any discrete geometrical representation herein may alternatively be a 3D mesh, each geometrical entity being a mesh tile or face. Any 3D mesh herein may be regular or irregular (i.e. consisting or not of faces of a same type). Any 3D mesh herein may be a polygonal mesh, for example a triangular mesh. Any 3D mesh herein may alternatively be a B-Rep. Any 3D mesh herein may be obtained from a 3D point cloud, for example by triangulating the 3D point cloud (e.g. with a Delaunay triangulation).

Any 3D point cloud herein may be determined from physical measurements on a real object, for example within a 3D reconstruction process. The 3D reconstruction process may comprise providing the real object, providing one or more physical sensors each configured for acquiring a respective physical signal, and acquiring one or more respective physical signals by operating the one or more physical sensors on the real object (i.e. scanning the real object with each sensor). The 3D reconstruction may then automatically determine a 3D point cloud and/or a 3D mesh based on the measurements, according to any known technique. The one or more sensors may comprise a plurality of (e.g. RGB, and/or image or video) cameras and the determination may comprise a structure-from-motion analysis. The one or more sensors may alternatively or additionally comprise one or more depth sensors (e.g. on an RGB-depth camera) and the determination may comprise a 3D reconstruction from depth data. The one or more depth sensors may for example comprise a laser (e.g. a lidar) or an ultrasound emitter-receiver.

Any 3D point cloud or 3D mesh herein may alternatively be obtained from a modeled object representing a skin (i.e. outer surface) of a solid (e.g. a B-Rep model), for example by ray-casting on the 3D modeled object or tessellating the 3D modeled object. The tessellating may be performed according to any 3D modeled object rendering process. Such a rendering process may be coded on any CAD system in order to display a graphical representation of the 3D modeled object. The 3D modeled object may be designed or have been designed by a user with a CAD system.

A modeled object is any object defined by data stored e.g. in the database. By extension, the expression "modeled object" designates the data itself. According to the type of the system performing the template-learning method, the manifold-learning method and/or the process, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

In the context of the present disclosure, a 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the template-learning method, the manifold-learning method, and/or the process, or the template-learning method, the manifold-learning method, and/or the process may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. Any 3D modeled object involved in the template-learning method, the manifold-learning method, and/or the process may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. Industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

In examples, any 3D modeled object of the present disclosure may represent a mechanical part which is one or a plausible combination of a molded part (i.e. a part manufactured by a molding manufacturing process), a machined part (i.e. a part manufactured by a machining manufacturing process), a drilled part (i.e. a part manufactured by a drilling manufacturing process), a turned part (i.e. a part manufactured by a turning manufacturing process), a forged part (i.e. a part manufactured by a forging manufacturing process), a stamped part (i.e. a part manufactured by a stamping manufacturing process) and/or a folded part (i.e. a part manufactured by a folding manufacturing process).

In the context of the present disclosure, a 3D modeled object may be a plausible (e.g. realistic) 3D modeled object. A plausible 3D modeled object may designate a 3D modeled object representing a plausible (e.g. realistic) mechanical part. A plausible mechanical part may designate a mechanical part realistically manufacturable in a real-world industrial manufacturing process. A plausible mechanical part may refer to a mechanical part which respects all the constraints that must be respected in order to realistically manufacture the mechanical part in a real-world industrial manufacturing process. The constraints may comprise one or any plausible combination of the following: mechanical constraints (e.g. constraints resulting from the laws of classic mechanics), functional constraints (e.g. constraints relative to one or more mechanical functions to be performed by the mechanical part once manufactured), manufacturing constraints (e.g. constraints pertaining to the ability of applying one or more manufacturing tools to the mechanical part during one or more manufacturing processes for manufacturing the mechanical part), structural constraints (e.g. constraints pertaining to the strength and/or resistance of the mechanical part) and/or assembly constraints (e.g. constraints defining how the mechanical part can be assembled with one or more other mechanical parts).

In the context of the present disclosure, by "dataset including 3D modeled objects", it is meant a dataset that comprises at least the 3D modeled objects. In examples, the dataset may be made of the 3D modeled objects. Alternatively, the dataset may strictly include the 3D modeled objects and may include additional data, such as specifications relative to the 3D modeled objects. The 3D modeled objects of the dataset may be discrete geometrical representations of 3D modeled objects. In other words, the dataset may include discrete geometrical representations (such as meshes and/or point clouds) of 3D modeled objects. In such cases, the discrete geometrical representations of the 3D modeled objects space may still be referred to as the 3D modeled objects themselves, and not their respective discrete representations, for the sake of simplicity. A dataset may have one or more sub-datasets. Each sub-dataset may form at least a part of (e.g. all) the dataset.

In the context of the present disclosure, a dataset including 30 modeled objects may be partitioned or substantially partitioned into one or more sub-datasets of 3D modeled objects. By "partitioned", it is meant that each 3D modeled object of the dataset belongs to one and only one sub-dataset forming the partition. By "substantially partitioned", it is meant that the sub-datasets form a partition of at least a part of the dataset. In such cases, the dataset is made of the at least a part and of another part, and the number of 3D modeled objects belonging to the another part is negligible compared to the number of 3D modeled objects belonging to any one of the sub-datasets. In examples, each sub-dataset is made of 3D modeled objects of one class of 3D modeled objects. In such examples, the dataset may be designated as "being partitioned by classes of 3D modeled objects". Specifically, let k be a number of classes, k being larger that one, for example larger than two. When it is said that "the dataset is partitioned or substantially partitioned into k classes of 3D modeled objects", it is meant that the dataset is partitioned into k sub-datasets, and that all 3D modeled objects of a respective one of the k sub-datasets belong to a respective one of the k classes. The concept of class will be further discussed below.

In the context of the present disclosure, a 3D modeled object may belong to a 3D modeled object space. The 3D modeled object space generally designates a space made of 3D modeled objects. The 3D modeled object space may be induced in (e.g. be a subspace of) a vector space. The 3D modeled object space may be a manifold of the vector space. The manifold may be a connected manifold. Alternatively, the manifold may be a disconnected manifold comprising one or more (e.g. two or more) connected components. Any dataset of 3D modeled objects involved in the present disclosure may be or may be strictly Included in a 3D modeled object space. In examples, the dataset is or is strictly included in the manifold. In these examples, the manifold may be a connected manifold or disconnected manifold. In these examples, the dataset may comprise one or more sub-datasets, each sub-dataset forming at least a part of the dataset, each sub-dataset being or being strictly Included in a connected component of the disconnected manifold.

In the context of the present disclosure, a class of 3D modeled objects may correspond to a connected manifold of a vector space. Alternatively or additionally, a class of 3D modeled objects may correspond to a connected component of a disconnected manifold of a vector space. Additionally or alternatively, a class of 3D modeled objects may designate a set of 3D modeled objects which has the following property: any first 3D modeled object of the set is similar to, e.g. has a shape similar to, at least a second 3D modeled object of the set. It is to be understood that a class of 3D modeled objects may be divided (e.g. partitioned) into one or more sub-classes, which will be still referred to as classes, for the sake of simplicity.

In examples, a class of 3D modeled object is made of 3D modeled objects representing respective mechanical parts, the mechanical parts relative (i.e. corresponding) to the class all respecting any one or any combination of the following conditions:
- the mechanical parts relative to the class are all manufactured in the same manufacturing process or in the same combination of manufacturing processes;
- the mechanical parts relative to the class are all plausible mechanical parts;
- the mechanical parts relative to the class are all from a same field of technology and/or industry;
- the mechanical parts relative to the class all perform a same mechanical function;
- the mechanical parts relative to the class each being represented by a 3D modeled object which has a shape similar to at least one other 3D modeled object of the class (thus representing another mechanical part relative to the class); and/or
- the mechanical parts relative to the class all obey to (e.g. satisfy, e.g. respect e.g. verify) same mechanical constraints, functional constraints, manufacturing constraints, structural constraints and/or assembly constraints.

Figure 6:
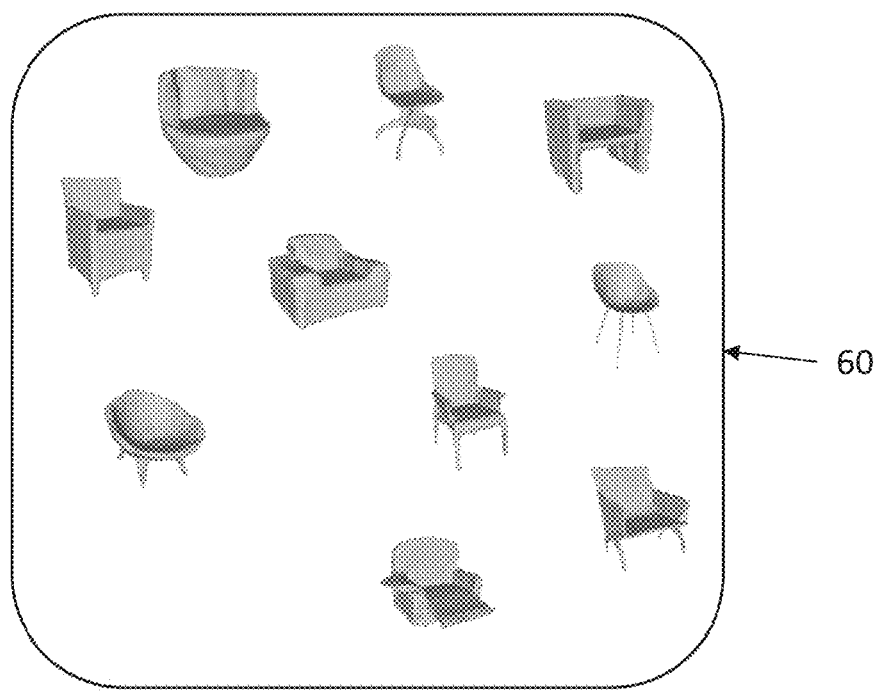

FIG. 6 shows an example of a dataset 60 of 3D modeled objects involved in the template-learning method, the manifold-learning method and/or the process. The dataset is made of 3D modeled objects of one class of 3D modeled objects. The 3D modeled objects of the class are chairs. The chairs form a class of 3D modeled object because they all perform the same mechanical function, which is supporting a weight (e.g. of a human being). Performing this mechanical function also means that the chairs all obey to same mechanical constraints, functional constraints and structural constraints. The chairs of FIG. 6 are plausible mechanical parts, because they respect mechanical constraints, functional constraints, manufacturing constraints and structural constraints, thereby allowing their manufacturing in the real-world by one or more manufacturing process. It is to be understood that not all objects of the dataset 60 are represented on FIG. 6. Only a part of the objects of the dataset 60 are represented for the sake of clarity, but the dataset may comprise more objects.

Figure 7:
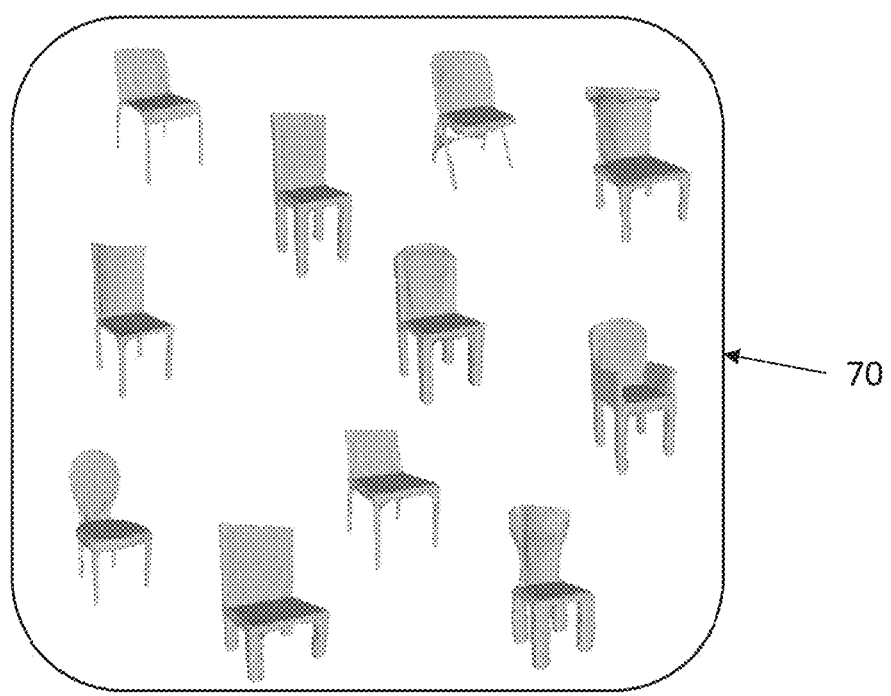

FIG. 7 shows an example of the dataset 70 of 3D modeled objects involved in the template-learning method, the manifold-learning method and/or the process. The dataset is made of 3D modeled objects of one class of 3D modeled objects. The 3D modeled objects of the class are chairs with four legs (each). The chairs with four legs form a class of 3D modeled object because they all perform the same mechanical function, which is supporting a weight (e.g. of a human being), and because performing this mechanical function with four legs also means that the chairs all obey to same mechanical constraints, functional constraints and structural constraints. The chairs of FIG. 7 are plausible mechanical parts, because they respect mechanical constraints, functional constraints, manufacturing constraints and structural constraints, thereby allowing their manufacturing in the real-world by one or more manufacturing process. It is to be understood that not all objects of the dataset 70 are represented on FIG. 7. Only a part of the objects of the dataset are represented for the sake of clarity, but the dataset may comprise more objects.

Figure 8:
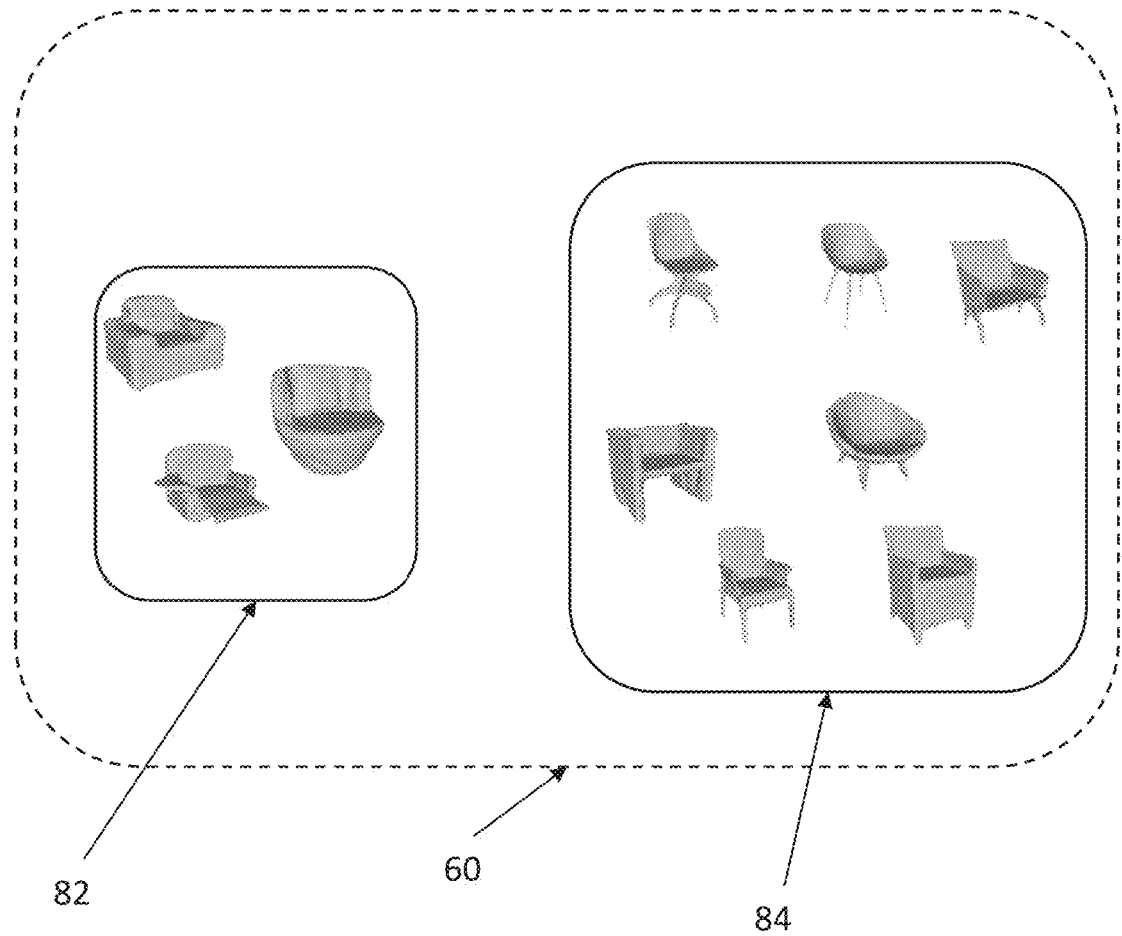

FIG. 8 shows an example of a partitioning of the dataset 60 of FIG. 6 into two sub-datasets 82 and 84. The first dataset 82 comprises chairs with no legs, which are chairs of a first class of chairs, and the second dataset 84 comprises chairs with four legs, which are chairs of a second class of chairs. In other words, the class of chairs discussed with reference to FIG. 6 may be partitioned into several classes of chairs, two of which being the first class and the second class. The chairs of the two classes obey to same functional constraints, because they perform the same mechanical function of supporting weights. Performing said same mechanical functions with different number of legs however implies obeying different mechanical constraints and/or structural constraints. In other words, the chairs of the first class all obey to a first set of mechanical constraints and/or structural constraints, the chairs of the second class all obey to a second set of mechanical constraints and/or structural constraints, and the constraints of the first and second set are different. It is to be understood that not all objects of the sub-dataset 82 (resp. 84) are represented on FIG. 8. Only a part of the objects of the sub-dataset 82 (resp. 84) are represented for the sake of clarity, but the sub-dataset may comprise more objects.

Other examples of 3D modeled objects are now discussed.

In the context of the present disclosure, any 3D modeled object may represent a car. Cars may form a class of 3D modeled objects. Alternatively or additionally, any 3D modeled object may represent a plane. Planes may form a class of 3D modeled objects. Alternatively or additionally, any 3D modeled object may represent a boat. Boats may form a class of 3D modeled objects.

The concept of "providing a dataset including 3D modeled objects", involved in the template-learning method, the manifold-learning method and the process, is now discussed.

The providing of the dataset may be carried out automatically or by a user. For instance, the user may retrieve the dataset from a memory where the dataset Is stored. The user may further choose to complete the dataset by adding (e.g. one by one) one or more 3D modeled objects to the already retrieved dataset. Adding one or more 3D modeled objects may comprise retrieving them from one or more memories and Including them in the dataset. Alternatively, the user may create the dataset from scratch by selecting (e.g. one by one) 3D modeled objects and forming (e.g. declaring) the dataset with these selected 3D modeled objects. Selecting a 3D modeled object may comprise retrieving it from a memory. A part of the 3D modeled objects of the dataset (e.g. all of them) may have been previously designed (e.g. by one or more other users) and then stored in one or more memories before being retrieved by the user. "Designing a 3D modeled object" designates any action or series of actions which is at least part of a process of elaborating a 3D modeled object.

In the context of the present disclosure, at any providing of a dataset, all 3D modeled objects of the dataset may be provided as point clouds. Alternatively, at least a part of the 3D modeled objects of the dataset (e.g. all of them) may be provided in another format (e.g. as CAD objects, e.g. as other discrete geometrical representations such as 3D meshes). In such a case, the providing of the dataset may comprise determining (e.g. extracting), from each 3D modeled object of the at least a part, a point cloud. The extracting of the point cloud may comprise raycasting the modeled object, e.g. on six orthographic views, as known in the art.

In examples, regardless of whether all 3D modeled objects of a dataset are provided as point clouds or if a raycasting has been carried out as previously discussed, 3D modeled objects of the dataset are at some point all points clouds. In these examples, the providing of the dataset may comprise a uniform sub-sampling of said point clouds so that each point cloud has the same fixed number of points, as known in the art. In an implementation, the uniform sub-sampling comprises, for each point cloud, picking first a random point of the point cloud and iteratively picking the furthest point of the point cloud from the already picked points, until said fixed number of points is reached.

Thus, in examples, whether an extracting step and/or a uniform sub-sampling step have been carried out or not, the 3D modeled objects of a dataset are provided as point clouds which all have the same fixed number of points. In these examples, the providing of the dataset may further comprise centering the point clouds and optionally applying a unit ball scaling to the centered point cloud, as known in the art.

The concept of "learning a neural network" is now discussed.

"Learning a neural network" designates the determination of a set of one or more neural networks (e.g. a neural network, e.g. a set of two or more neural networks) by means of machine-learning methods. In the context of the present disclosure, each neural network of the set has (e.g. is parametrized by) weights and learning the neural network may generally comprise initializing the weights and updating the weights. Notably, the modifying S420 of respective weights of the neural networks of the set according to the manifold-learning method is part of the learning S40 of the set of neural networks. In the context of the present disclosure, the learning of each neural network of the set may comprise a training based on a dataset (resp. a sub-dataset of a dataset). By this, it is meant in examples that the dataset (resp. the sub-dataset of a dataset) is part of a training set (e.g. of a learning set) but that only the dataset (resp. the sub-dataset of a dataset), and thus no other part of the training set, is directly involved in the modifying S420 of the weights of the neural network. For examples, the modifying S420 of the weights may be carried out based on data (e.g. results of computations) relative to (e.g. obtained from, e.g. derived from) 3D modeled objects of the dataset (resp. the sub-dataset of a dataset) only. For examples, this may be the case if the learning S40 and/or the modifying S420 comprises minimizing a loss which operates a selection among 3D modeled objects of the training set, such that the modifying S420 of respective weights only involves 3D modeled objects chosen by the selection.

Any neural network learnt according to the present disclosure may be a neural network configured for inference of 3D modeled objects. This means that the neural network outputs values in a 3D modeled object space or in a subset of a 3D modeled object space, for example in a class of 3D modeled objects. Additionally or alternatively, the neural network may be configured for inference of deformations of a base template each into respective 3D modeled objects. The concept of "base template" will be further discussed hereinafter, but in any case "a base template" designates a 3D modeled object. A deformation of a base template into a respective 3D modeled object may be a set of one or more geometrical transformations which maps the base template into the respective 3D modeled object. In such cases, inferring the deformation may comprise inferring the one or more geometrical transformations and/or their parameters. Alternatively or additionally, if the base template and the respective 3D modeled objects are or a represented by, respectively, a first 3D mesh (resp. a first point cloud) and a second 3D mesh (resp. a second point cloud), a deformation of a base template into a respective 3D modeled object may be a set of respective correspondences between each vertex (resp. point) of the first 3D mesh (resp. the first point cloud) and each vertex (resp. point) of the second 3D mesh (resp. the second point cloud). In such cases, inferring a deformation may comprise inferring such correspondences. Inferring a deformation may further comprise inferring the respective 3D modeled object into which the base template is mapped by the set of one or more geometrical transformations. In other words, the output of the neural network may comprise the set of one or more geometrical transformations and the respective 3D modeled object. In examples, the neural network is an autoencoder which comprises a decoder configured for the inference of the 3D modeled objects and/or the inference of the deformation.

The concept of autoencoder is now discussed. An autoencoder may be cited paper [3]) $f_w: \mathbb{R}^m \to \mathbb{R}^p$ and $g_{w'}: \mathbb{R}^p \to \mathbb{R}^m$, parameterized by the weights w and w', where p<<m. $f_w$ is the encoder, and $g_{w'}$ the decoder. $\mathbb{R}^p$ is the latent space, i.e. the vector space where the encoder $f_w$ outputs its values and where the decoder $g_{w'}$ takes its values. p is the dimension of the latent space. $\mathbb{R}^m$ is the space where the encoder $f_w$ takes its values and where the decoder $g_{w'}$ outputs its values. $\mathbb{R}^m$ may be referred to as "the original input space". m is the dimension of the original input space. In the context of the present disclosure, the original input space may be or may strictly include a 3D modeled object space. In other words, the encoder $f_w(x)$ takes its values in the original input space, but the image of the latent space by the decoder $g_{w'}$, e.g. a 3D modeled object space, may be a subset of the original input space. A vector $z=f_w(x)$ may be referred to as "a latent vector" or "a hidden vector". The autoencoder $g_{w'} \circ f_w(x)$ may also be referred to as "a reconstruction". The reconstruction takes as input a first element of the original input space (for instance, a first 3D modeled object of a 3D modeled object space), maps it onto a latent vector (i.e. an element of the latent space), and then reverse the mapping by outputting a second element of the original input space (for instance, a second 3D modeled object of the 3D modeled object space) from the latent vector. The second element may be referred to as "a reconstruction" of the first element. In examples it means that the second element represents an approximation of the first element. In examples, if x is a 3D modeled object, the 3D modeled object $g_{w'} \circ f_w(x)$ may be referred to as the reconstructed 3D modeled object. x may also be referred to as the input and $g_{w'} \circ f_w(x)$ as the reconstructed input. In the context of the process, the encoder $f_w$, and the decoder $g_w$ may be machined-learnt (e.g. separately or simultaneously), e.g. by minimizing a reconstruction error. Encoding an object means applying the encoder to the object. The result of the encoding may thus be referred to as "the encoded object". Encoding an object may also be referred to as "projecting the object (e.g. on the latent space, e.g. of the encoder)" and the result of the encoding may be referred to as "the projected object". Decoding a latent vector means applying the decoder to the latent vector. The result of the decoding may thus be referred to as "the decoded latent vector".

An implementation of learning an autoencoder is now discussed. Let $D=\{x_1, \ldots, x_n\} \subset \mathbb{R}^m$ be a training set, where n is the number of 3D modeled objects in the training set. In this implementation, learning the autoencoder $g_w \circ f_w$ comprises optimizing a reconstruction loss $E(w,w')=\Sigma_{i=}^n \mathcal{L}(g_{w'} \circ f_w(x_i) - x_i)$, where $\mathcal{L}$ is a distance comparing the input sample and the reconstructed sample by the autoencoder, for example $\mathcal{L}$ can be the $L^2$ norm. The learning process can be made more robust by applying a random noise to each sample $x_i + \eta$ and train the autoencoder to reconstruct the clean version $x_i$. Such an example may be referred to as "a denoising autoencoder" (introduced in earlier cited paper [5]). In the context of the present disclosure, the learning may also pre-train the architecture in a greedy layer-wise fashion, as explained in earlier cited paper [6], a version called stacked autoencoder.

The determining S30 of base templates is now discussed.

In the context of the present disclosure, the determining S30 of a base template is carried out for each sub-dataset of a dataset including 3D modeled objects which each represent a respective mechanical part, the dataset having one or more sub-datasets, each sub-dataset forming at least a part of the dataset. In other words, for each respective sub-dataset, a base template is determined S30.

The determining S30 of a base template for one respective sub-dataset is now discussed. It is to be understood that the following discussion applies to the determining S30 of any base template for any respective sub-dataset A base template is a 3D modeled object, for instance representing a mechanical part. The base template may be a mesh or a point cloud. The base template is a 3D modeled object which represents a centroid of the 3D modeled objects of the sub-dataset. It may mean that the geometrical shape of the base template represents (e.g. is) a mean geometrical shape (e.g. according to a distance such as a Hausdorff distance, a Wasserstein distance, an Earth Mover's distance or a Chamfer distance) of the shapes of the 3D modeled objects of the sub-dataset. In examples, the 3D base template is a 3D modeled object of the sub-dataset whose average dissimilarity to all the 3D modeled objects of the sub-dataset is minimal. The dissimilarity between a first 3D modeled object and a second 3D modeled object may be a quantification of a difference between the geometrical shape of the first 3D modeled object and the geometrical shape of the second 3D modeled object, e.g. according to a Hausdorff distance, a Wasserstein distance, an Earth Mover's distance or a Chamfer distance.

Figure 9:
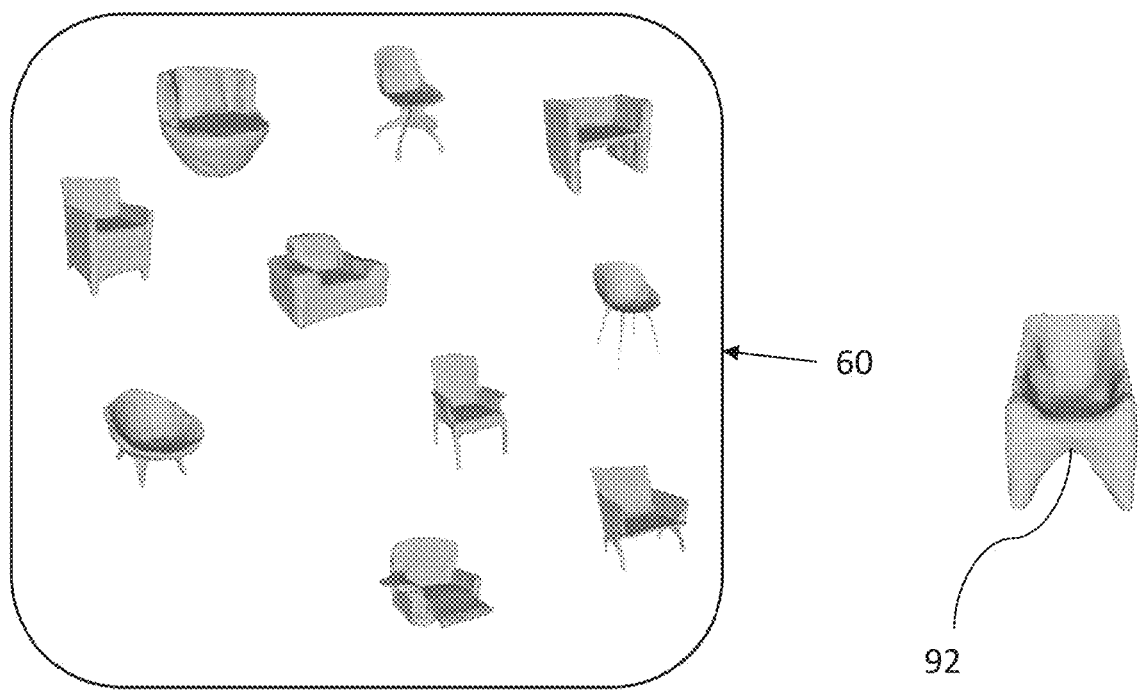
Figure 10:
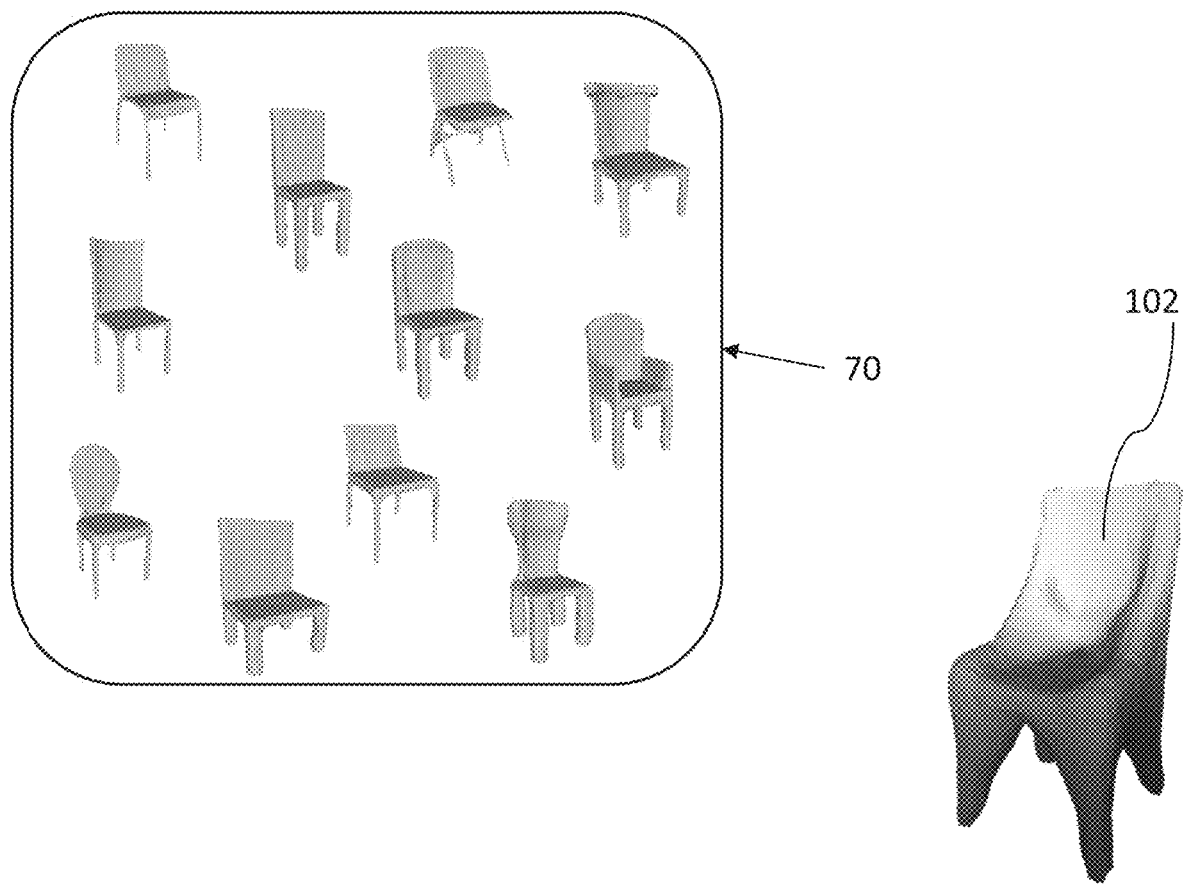

FIG. 9 shows an example of a determined base template 92 which represents a centroid of the dataset 60 of FIG. 6. FIG. 10 shows an example of a determined base template 102 which represents a centroid of the dataset 70 of FIG. 7.

In examples, the determining S30 of the base template comprises computing S300 a minimum, within candidate base templates, of a loss which, for each 3D modeled object of the sub-dataset, penalizes a disparity between the 3D modeled object of the sub-dataset and a candidate base template.

Computing S300 a minimum of the loss within candidate base templates may comprise exploring (e.g. iteratively) 3D modeled objects and assessing an effect of each explored 3D modeled object on the loss. In such cases, a candidate base template designates an explored 3D modeled object. A candidate base template may be a 3D modeled object, e.g. resulting from a deformation of a 3D modeled object (e.g. another candidate base template) or from successive deformations of 3D modeled objects (e.g. candidate base templates). The computing S300 of a minimum of the loss may comprise the use of any relaxation algorithm.

The loss may be a quantity (e.g. a function) which, for each 3D modeled object of the sub-dataset, measures a (e.g. geometric) similarity and/or a dissimilarity between the 3D modeled object and a candidate base template. The loss may for example be a function which takes as parameter each 3D modeled object of the sub-dataset, which takes as input a candidate base template, and which outputs a quantity (such as a positive real number) expressing (e.g. geometric) similarities and/or dissimilarities between the input candidate base template and the 3D modeled objects of the sub-dataset. For each 3D modeled object, the disparity between the 3D modeled object and the candidate base template may be a quantification of a (e.g. geometric) dissimilarity between the 3D modeled object and the candidate base template. Penalizing the disparity may mean that the loss is an increasing function of the disparity.

Thus, the determining S30 of the base template may reward, among 3D modeled objects (the candidate base templates), similarities with 3D modeled objects of the sub-dataset. Notably, the determining S30 of the base template may iteratively explore (e.g. visit) candidate base templates, and for each one of them, seek and reward similarity of the explored candidate base template with each 3D modeled object of the sub-dataset, which results in that the determined S30 base template represents a centroid of the 3D modeled object of the sub-dataset.

In examples, the disparity between the 3D modeled object of the sub-dataset and a candidate base template is a function of a distance between the 3D modeled object and the candidate base template.

The distance is a particularly simple and efficient manner of measuring similarity and/or dissimilarity between 3D modeled objects.

The distance may be any distance between 3D modeled objects, for example a distance which quantifies a (e.g. geometric) dissimilarity between 3D modeled objects. Thus, the distance between the 3D modeled object and the candidate base template may quantify a (e.g. geometric) dissimilarity between the 3D modeled object and the candidate base template. The distance may for instance be a Wasserstein distance, an Earth mover's distance, a Chamfer distance or an Haussdorf distance. The disparity may be an increasing function of the distance, such as the square of the distance.

In examples, the distance is a distance between a first point cloud representing the 3D modeled object and a second point cloud representing the candidate base template.

As previously discussed, each 3D modeled object of the sub-dataset may be provided as a point cloud (thus, which represents the 3D modeled object), or a point cloud representing the 3D modeled object may be determined from another format into which the 3D modeled object is provided. In any case, the determining S30 of the base template may manipulate point clouds representing each a 3D modeled object of the sub-dataset. Being 3D modeled objects as well, the candidate base templates may also be represented by respective point clouds, which optionally may be determined from other 3D modeled object formats. Thus, the distance may be any distance between point clouds, such as a Wasserstein distance or an Earth Mover's distance.

In examples, the loss is of the type:

$L_1(S_j) = \Sigma_{i=1}^{p_j} D_1(S_j, x_{i,j})$, where:

$D_1(S_j, x_{i,j})$ is the function of the distance between $S_j$ and $x_{i,j}$;

$S_j$ is a second point cloud;

$p_j$ is the number of 3D modeled objects in the respective sub-dataset; and $x_{1,j}, x_{2,j}, \ldots, x_{p_j,j}$ are first point clouds.

In examples, $D_1(S_j, x_{i,j})$ is the Earth mover's distance Loss, given by the formula:

$$D_1(S_j, x_{i,j}) = \min_{\substack{\varphi: S_j \to x_{i,j} \\ \varphi \text{ bijective}}} \sum_{y \in S_j} \|y - \varphi(y)\|_2^2.$$

In examples, the computing S300 comprises providing a base 3D modeled object. In these examples, the computing S300 further comprises iterating the following, starting with the base 3D modeled object: assessing an effect of a previous candidate base template on the loss, and deforming the previous candidate base template into a new candidate base template.

The base 3D modeled object is a 3D modeled object. The base 3D modeled object is a candidate base template. The base 3D modeled object may be provided as any 3D modeled object of the dataset is provided S10. In other words, the providing of the base 3D modeled object may be carried out as the providing S10 of any object, and in examples, e.g. (e.g. substantially) at the same time.

The iterating is now discussed. The iterating starts with the base 3D modeled object. The computing S300 may explore (e.g. visit) the base 3D modeled object and may assess an effect of the base 3D modeled object on the loss. Assessing the effect of the base 3D modeled object on the loss may comprise computing the loss and/or a derivative of the result of computing the loss. Assessing the effect of the base 3D modeled object may further comprise determining whether the result of the computing of the loss and/or the derivative of the result of the computing of the loss are such that the loss is sufficiently small, e.g. according to a convergence parameter of a relaxation algorithm performing the computing S300. In examples, if the effect on the loss is such that the loss is not sufficiently small, then the base 3D modeled object is deformed into a new candidate base template. The iterating then carries on: for each candidate base template resulting from a deformation of a previous candidate base template, the iterating comprises assessing an effect of the candidate base template on the loss, where this assessing can be carried out as the assessing of the effect of the base 3D modeled object. In examples, if the effect on the loss is such that the loss is not sufficiently small, then the candidate base template is deformed into a new candidate base template, an effect of the new candidate base template on the loss is assessed, and so on. In other words, as long as sufficient smallness of the loss is not achieved, the iterating explores successively candidate base templates which are deformations to one another and deforms candidate base templates into one another as a result of non-sufficient smallness of the loss.

The concept of deforming a previous candidate base template into a new candidate base template is now discussed. As previously discussed, for each 3D modeled object of the sub-dataset, the loss for the previous candidate base template penalizes the disparity between the 3D modeled object and the previous candidate base template. Assessing the loss may comprise determining one or more 3D modeled objects of the sub-dataset for which the respective disparities between each respective 3D modeled object and the previous candidate base template are the least penalized disparities (i.e. among all disparities of the loss). The deforming of the previous candidate base template may then comprise assigning the one or more 3D modeled objects to the previous candidate base template. The deforming of the previous candidate base template may further comprise transforming the previous candidate base template into a centroid, e.g. according to the distance, of the one or more 3D modeled objects. In such cases, the centroid may form the new candidate base template.

In other words, the computing S300 starts from a base 3D modeled object, and iteratively deforms it into successive candidate base template, until the dissimilarity of one of the candidate base templates to (e.g. all) 3D modeled objects of the sub-dataset is acceptable (e.g. lower than the convergence parameter, e.g. optimal). This constitutes an efficient manner of deforming a 3D modeled object into a centroid of the sub-dataset.

In examples, the base 3D modeled object represents a sphere. Additionally or alternatively the loss may penalize, for each 3D modeled object of the sub-dataset, an Earth Mover's distance loss between a first point cloud representing the 3D modeled object of the dataset and a second point cloud representing the new candidate base template.

The base 3D modeled object may be a point cloud representing the sphere, such as a unit sphere. In such cases, each new candidate base template, being a result of a deformation of a previous candidate base template, is the result of iterative deformations of the sphere. Each new candidate base template may thus be represented by a point cloud which results from iterative deformations of the point cloud representing the sphere.

The sphere is a particularly convenient base 3D modeled object, because a point cloud representing a sphere can easily be deformed into point clouds representing a great number of 3D modeled objects, such as 3D modeled objects homeomorphic to a sphere. Using a unit sphere is particularly adapted to the case where the 3D modeled objects of the sub-dataset are provided S10 as point clouds which are centered and scaled according to a unit ball scaling. The Earth Mover's distance is particularly adapted to the use of spheres as base 3D modeled objects.

In examples, the base 3D modeled object is a point cloud. In these examples, the iterating results in an optimized point cloud. In these examples, the determining S30 of the base template may further comprise inferring S330 normals on points of the optimized point cloud. In these examples, the determining S30 of the base template may further comprise performing S340 a surface reconstruction of the optimized point cloud based on the inferred normals.

The point cloud is optimized, as it results from iterative deformations of the point cloud representing the base 3D modeled object, said deformations being carried out for deforming the point cloud representing the base 3D modeled object into a point cloud which represents a minimum the loss (or, at least, represents an approximation of a minimum of the loss).

Inferring S330 the normals may be carried out by any method able to infer normals on points of a point cloud. The normals provide topological information on the optimized point cloud. Performing the surface reconstruction may be carried out by any method able to infer a surface meshing the point cloud, based on the point cloud and the inferred normals. As a result, the determined S30 base template may be outputted as a 3D mesh representing the centroid of the sub-dataset. In other words, in examples, the determined S30 base template is the result of the performing S340 of the surface reconstruction.

The points of the point cloud representing the base 3D modeled object are optimized, at least from a geometrical point of view. In other words, the optimized point cloud may accurately represent a centroid of the 3D modeled object only from a geometrical point of view but may not have the correct topology. For instance, the sub-dataset may be made of 3D modeled objects of a class, and the optimized point cloud may geometrically represent a centroid of the sub-dataset, but may have a wrong topology, e.g. which is such that the optimized point cloud, e.g. if meshed naively, does not represent a 3D modeled object of the class. Inferring S330 the normals and performing S340 the subsequent surface reconstruction allows to circumvent these difficulties, and to re-mesh the optimized point cloud so that the new mesh has the correct topology. The determined S30 base template may thus be, in these examples, a 3D modeled object representing a centroid of 3D modeled object of the class.

Figure 11:
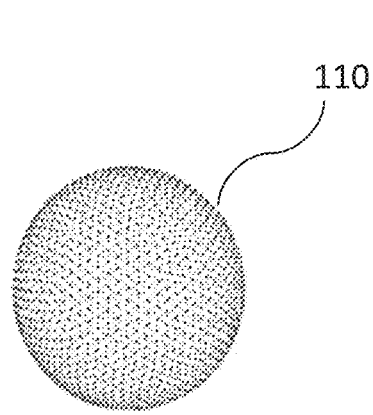
Figure 12:
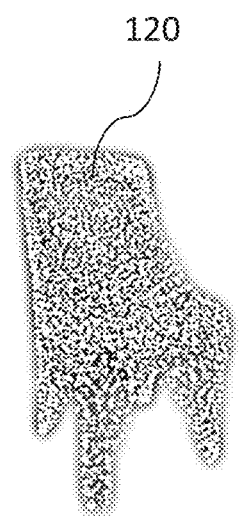
Figure 13:
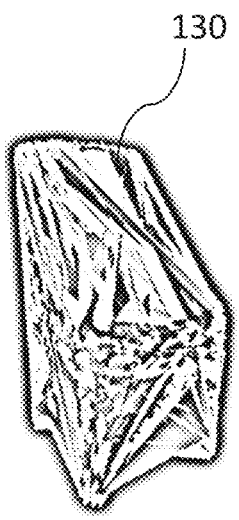
Figure 14:
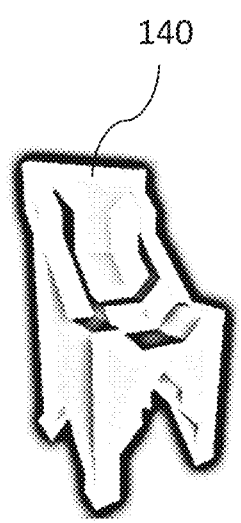
Figure 15A:
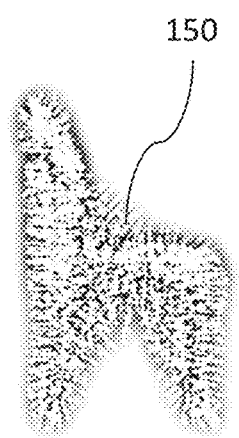
Figure 15B:
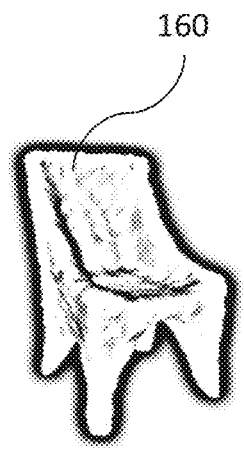

An implementation of the inferring S330 of the normals and of the performing S340 of the surface reconstruction is now discussed, with reference to FIGS. 11-16. FIG. 11 shows an example of the base 3D modeled object 110, which is a point cloud representing a sphere. FIG. 12 shows the optimized point cloud 120 representing a chair. The optimized point cloud has the wrong topology, as illustrated in FIG. 13 showing the optimized point cloud 120 with its wrong topology. As seen on FIG. 13, the optimized point cloud 130 has not the topology of a chair, which it should have. In this implementation, the determining S30 of the base template comprises providing S310 a coarse grid in which the determining S30 puts the optimized point cloud. Each voxel containing a point has value 1, the other voxels having a null value. In this implementation, the determining S30 further comprises extracting S320 a coarse mesh from the grid. The extracting S320 of the coarse mesh may be carried out by applying a marching cubes algorithm, with an isovalue near 1. FIG. 14 show the coarse mesh 140 extracted from the optimized point cloud 120 of FIG. 12. In this implementation, the inferring S330 of the normals comprises using the coarse mesh from the marching cubes algorithm in order to compute accurately the normals for each point of the optimized point cloud 120. The inferring S330 of the normals may comprise projecting each point onto the nearest triangle of the coarse mesh and assigning for its normal the weighted average of the normals of the triangle, the weights being the barycentric weights of the projected point. FIG. 15A shows the optimized point cloud 150 of FIG. 12 with the inferred normals. With these proper normals, the determining S30 further comprises performing S340 a Poisson surface reconstruction. This allows obtaining of a base template which is a 3D mesh with an accurate topology. The determining S30 may optionally comprise, decimate the 3D mesh if there are too many vertices. FIG. 15B shows an example of the 3D base template 160 obtained from the optimized point cloud 150 with the inferred normals of FIG. 15A by performing S340 the Poisson surface reconstruction.

The determining S30 of the base template for one respective sub-dataset has been discussed. It is to be understood that, in case there are two or more respective sub-datasets, for each respective sub-dataset, the determining of the base template for the respective sub-dataset may be performed identically. All base templates for all respective sub-datasets may be determined S30 simultaneously. Notably, in examples, the simultaneous determining S30 of these base templates comprises, simultaneously and for each respective sub-dataset, the computing S300 of a minimum of a loss, the computing S300 being, for each respective sub-dataset, performed as previously discussed.

Examples of the simultaneous determining S30 of these base templates by computing S300, simultaneously and for each respective sub-dataset, a minimum of the loss, are now discussed.

In these examples, the computing S300, simultaneously and for each respective sub-dataset, of a minimum of the loss comprises minimizing a common loss. Minimizing the common loss may correspond to (e.g. imply, e.g. be equivalent to) to performing, as previously described, each computing S300 for each respective sub-dataset. For each 3D modeled object of the dataset, the common loss selects a term among a plurality of terms. Each term penalizes a disparity between the 3D modeled object and a candidate base template. The selected term may be a term among the plurality of terms for which the disparity is the least penalized.

The common loss may be a quantity (e.g. a function) which, for each 3D modeled object of the dataset, measures two or more (e.g. geometric) respective similarities and/or dissimilarities between the 3D modeled object and a respective candidate base template. Each term of the plurality of terms may be a measure of a respective one of the two or more (e.g. geometric) respective similarities and/or dissimilarities. Thus, the disparity, penalized by the term, between the 3D modeled object and the respective candidate base template may be a quantification of a (e.g. geometric) dissimilarity between the 3D modeled object and the candidate base template. Penalizing the disparity may thus mean that the term is an increasing function of the disparity. The common loss selects, among the plurality of terms, and for each 3D modeled object of the dataset, a term that is the least penalized. In examples, it means that the common loss is a function that takes as parameters the 3D modeled objects of the dataset and as input candidate base templates, and that outputs a quantity (e.g. a positive real number) which is a function (for instance a sum) of each term which is selected for each 3D modeled object. In other words, the loss may output a result expressing, for each 3D modeled object of the dataset, which candidate base template(s) is(are) (e.g. the most) similar (e.g. geometrically) to the 3D modeled object. The minimizing of the common loss may use any relaxation algorithm, such as mini-batches stochastic gradient relaxation algorithm.

In examples, the disparity between the 3D modeled object and the respective candidate base template involves a distance between the 3D modeled object and the respective candidate base template.

The distance is a particularly simple and efficient manner of measuring similarity and/or dissimilarity between 3D modeled objects.

The distance may be any distance, such as a Haussdorf distance, a Wasserstein distance, a Chamfer distance or an Earth Mover's distance. In examples, the disparity involves the distance between the 3D modeled object and the respective candidate base template in that the disparity is a (e.g. increasing) function of the distance between the 3D modeled object and the respective candidate base template. In examples, the disparity involves the distance between the 3D modeled object and the respective candidate base template in that the disparity depends on a result relative to the computation of the distance between the 3D modeled object and the respective candidate base template.

In examples, the distance is a distance between a first point cloud representing the 3D modeled object and a second point cloud representing the respective candidate base template.

As previously discussed, each 3D modeled object of the dataset may be provided as a point cloud (thus, which represents the 3D modeled object), or a point cloud representing the 3D modeled object may be determined from another format into which the 3D modeled object is provided. In any case, the determining S30 may manipulate point clouds representing each a 3D modeled object of the dataset. Being 3D modeled objects as well, the respective candidate base templates may also be represented by respective point clouds, which optionally may be determined from other 3D modeled object formats. Thus, the distance may be any distance between point clouds, such as a Wasserstein distance or an Earth Mover's distance.

In examples, the common loss is of the type:

$$L_1(S_1, S_2, \ldots, S_k) = \sum_{j=1}^{k} \sum_{i=1}^{p_j} \min_{j=1,\ldots,k} D_1(S_j, x_{i,j}),$$

where:
- $S_1, S_2, \ldots, S_k$ are second point clouds;
- for each $j \in (1, 2, 3, \ldots, k)$, $p_j$ is the number of 3D modeled objects in the $j^{th}$ respective sub-dataset of the dataset of 3D modeled objects, and $x_{1,j}, x_{2,j}, \ldots, x_{p_j,j}$ are first point clouds representing 3D modeled objects of the respective sub-dataset;
- $\Sigma_{j=1}^{k} p_j = n$, where n is the number of 3D modeled objects in the dataset;
- $D_1(S_j, x_{i,j})$ is a term involving a distance between a respective candidate base template $S_j$ and a 3D modeled object of the dataset $x_{i,j}$;

In examples, $D_1(S_j, x_{i,j})$ is the Earth mover's distance Loss, given by the formula:

$$D_1(S_j, x_{i,j}) = \min_{\substack{\varphi: S_j \to x_{i,j} \\ \varphi \text{ bijective}}} \sum_{y \in S_j} \|y - \varphi(y)\|_2^2.$$

In examples, minimizing the common loss $L_1(S_1, S_2, \ldots, S_k)$, results in (e.g. Implies, e.g. is equivalent to) the computing S300, simultaneously and for each respective sub-dataset, of a minimum of the loss $L_1(S_j) = \Sigma_{i=1}^{p_j} D_1(S_j, x_{i,j})$, which has been previously discussed.

An implementation of the determining S30 of k base templates, where $k \geq 2$ is now discussed.

In this implementation, the dataset consists in n 3D modeled objects, denoted $\{x_1, x_2, \ldots, x_n\}$. Each 3D modeled object $x_1$ is a point cloud which is centered and scaled according to a unit ball scaling. m is the common number of point of each point cloud $x_i$. The determining S30 comprises minimizing a common loss and minimizing the common loss comprises providing k point clouds $S_1, \ldots, S_k$ each representing a base 3D modeled object that is a unit sphere with m points. In this implementation, the determining S30 comprises adding a very small noise to each point cloud $S_j$, such that each base 3D modeled object is very slightly different from each other. This facilitates the determining S30 of k centroids of k respective sub-datasets of the dataset, as each base 3D modeled object is, from the beginning, already different from other base 3D modeled objects, and thus already slightly specialized into representing a common shape of some 3D modeled object of the dataset.

In this implementation, the common loss which is minimized is of the type:

$$L_1(S_1, \ldots, S_k) = \sum_{i=1}^{n} \min_{j=1,\ldots,k} \min_{\substack{\varphi: S_j \to x_i \\ \varphi \text{ bijective}}} \sum_{y \in S_i} \|y - \varphi(y)\|_2^2,$$

where $$D_1(S_j, x_i) = \min_{\substack{\varphi: S_j \to x_i \\ \varphi \text{ bijective}}} \sum_{y \in S_j} \|y - \varphi(y)\|_2^2$$

is the Earth Mover's distance loss between a first point cloud $x_i$ representing a 3D modeled object of the dataset and a second point cloud $S_j$ representing a candidate base template. The minimizing of the common loss may be carried out by using the relaxation algorithm presented in earlier cited paper [12] to optimize the points of each sphere in order to minimize (by mini-batches stochastic gradient descent) the loss.

Each base 3D modeled object is optimized by the determining S30 in a base template shape representing a kind of shape different from the other optimized base 3D modeled object, since for each training model the minimum will only optimize the nearest base 3D modeled object. Each base 3D modeled object will specialize itself in a specific base template, representative of a centroid of the 3D modeled object of a respective sub-dataset of the dataset, different from the other respective sub-dataset. In other words, each base template represents a centroid of its own cluster in the dataset of 3D models provided with the Earth Mover's distance.

In order to force each base 3D modeled object to specialize to its own 3D modeled object shape, this implementation of the determining S30 may also use a reassignment algorithm during mini-batches training. Indeed, it could happen that all 3D modeled objects reach their minimum loss for the same base template, impeding the other base 3D modeled object to be optimized. To hinder that effect, in each mini-batch during training, for each previous candidate base template, the determining S30 may sort in decreasing order the first point clouds according to their loss for the previous candidate template (first reassignment algorithm). Alternatively, the determining S30 may sort the first point clouds according to the loss difference between the previous candidate base template and the best candidate base template reconstructing this 30 modeled object (second reassignment algorithm). The determining S30 may then force the top $\Omega$ (where $\Omega$ is a small proportion of the mini-batch size) to be assigned to the previous candidate base template, meaning that determining S30 changes the $$\min_{j=1,\ldots,k}$$

and its resulting argmin for this first point cloud to force the backpropagation to go through this template for this first point cloud. As a result, the previous candidate base template may be deformed into a new candidate base template.

The first and second reassignment algorithms are now discussed. Both algorithms take as inputs:
the mini batch $x_1, \ldots, x_B$ (B is the mini-batch size);
$\Omega$ (must be $\leq B/k$);

for $i = 1$ to $B$: $d_i = \min_{j=1,\ldots,k} D_1(S_j, x_i)$;

for $i = 1$ to $B$: $I_i = \operatorname*{argmin}_{j=1,\ldots,k} D_1(S_j, x_i)$ (thus $d_i = D_1(S_{I_i}, x_j)$).

Both algorithms output:
the loss $L_1$ for the whole mini-botch after reassignment.
The following is a pseudo code of the first reassignment algorithm:

```
L = d₁ +... + d_B
for i = 1 to k
    c = number of elements in [I₁,...,I_B] which are equal to i
    if c < Ω
        D = [D₁(Sᵢ,x₁),..., D₁(Sᵢ,x_B)]
        [a₁,...,a_Ω] = indices which correspond to the Ω lowest elements
        in
            D
        for j = 1 to Ω
            L = L - d_{aⱼ} + D₁(Sᵢ,x_{aⱼ})
            I_{aⱼ} = i
```

The following is a pseudo code of the second reassignment algorithm:

```
L = d₁ +... + d_B
for i = 1 to k
    c = number of elements in [I₁,...,I_B] which are equal to i
    if c < Ω
        D = [D₁(Sᵢ,x₁) - d₁,..., D₁(Sᵢ,x_B) - d_B]
        [a₁,...,a_Ω] = indices which correspond to the Ω lowest elements
        in
            D
        for j = 1 to Ω
            L = L - d_{aⱼ} + D₁(Sᵢ,x_{aⱼ})
            I_{aⱼ} = i
```

The minimizing of the common loss $L_1$ results in k optimized point clouds corresponding to the optimization the vertices of each 3D base template but may not take into account the topology. This may lead to base templates with accurate point clouds but wrong topology. Thus, the determining S30 may comprise a remeshing of the base templates. In such cases, the determining S30 may comprise, for each base template, providing S310 a coarse grid into which the determining S30 puts the base template. Each voxel containing a point has value 1, the other voxels having a null value. The determining S30 may then comprise extracting S320 a coarse mesh from each coarse grid, e.g. by applying a marching cubes algorithm with an isovalue near 1. The determining S330 may then comprise inferring S330 normals on the points of each optimized point cloud. The inferring S330 of the normals may comprise using the coarse mesh from the marching cubes algorithm in order to compute accurate normals for each point of each optimized point cloud. This may consist in projecting each point onto the nearest triangle of the coarse mesh and assigning for its normal the weighted average of the normals of the triangle, the weights being the barycentric weights of the projected point. With these proper normals, the determining S340 may comprise performing a (e.g. Poisson) surface reconstruction on each optimized point cloud, in order to get a base template with an accurate topology, that may be ultimately decimated if there are too many vertices.

Figure 16:
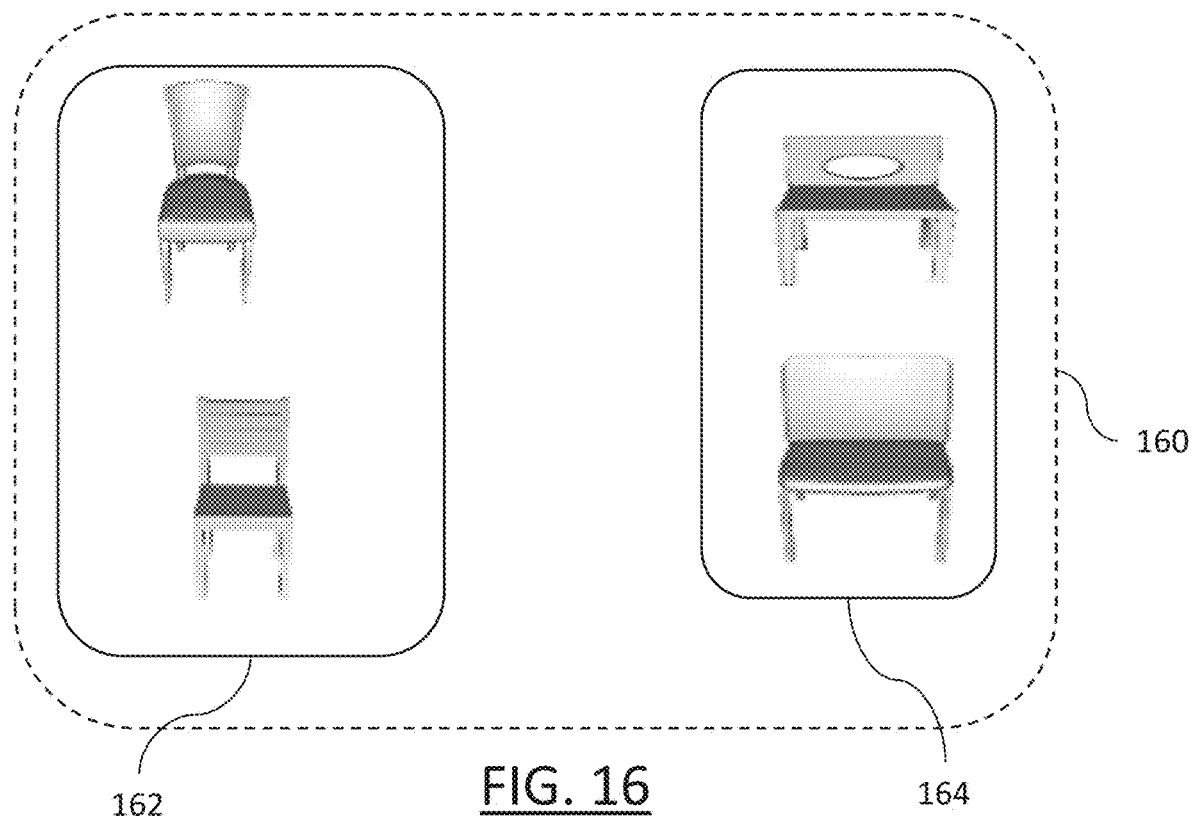
Figure 17:
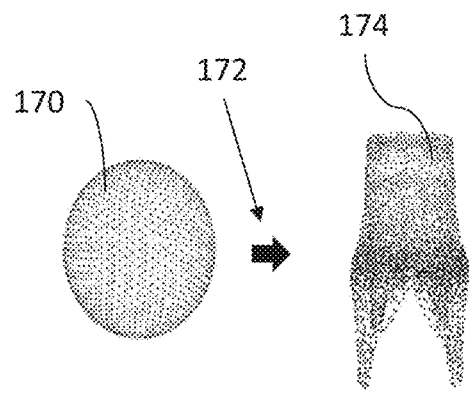
Figure 18:
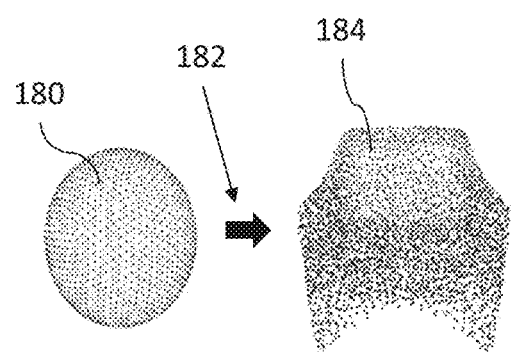
Figure 19:
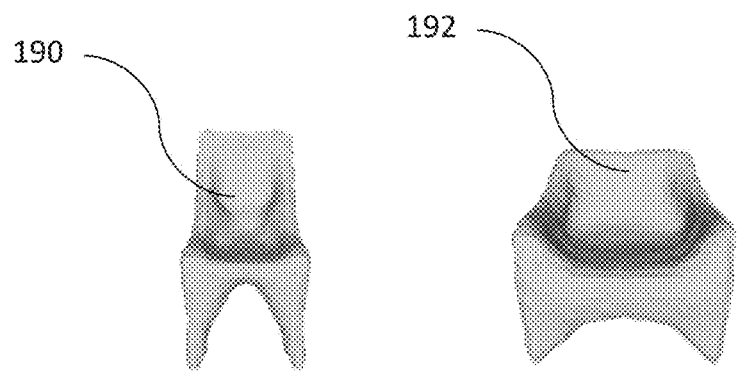

An example where two base templates are determined S30 is now discussed with reference to FIG. 16-19. FIG. 16 shows an example of the dataset 160 which is made of chairs with four legs. The dataset is partitioned Into two classes of chairs with four legs, a first class 162 made of chairs with four legs and narrow chair backs and a second class 164 made of chairs with four legs and wide chair backs. FIG. 17. and FIG. 18 respectively illustrate the determining S30 of a first base template representing a centroid of the first class 162 and of a second base template representing a centroid of the second class 164. Point clouds 170 and 180 are two base 3D modeled objects, each iteratively deformed 172, 182, into optimized point clouds 174 and 184. FIG. 19 shows the first base template 190 and the second base template 192 which are surface reconstructions of the optimized point clouds 174 and 184, respectively.

The learning S40 of neural networks is now discussed.

As previously discussed, learning S40 neural networks designates the determination of a set of one or more neural networks, for example two or more neural networks. Each neural network of the set has respective weights. Learning S40 the set of neural networks may comprise providing S400 the set of neural networks. The providing S400 of the set of neural networks may be carried out by a user. For instance, the user may retrieve the set of neural networks from a memory where the dataset is stored. Each neural network may be provided S400 as a structure, but the training of the neural network still must be done. In other words, the structure of each neural network, comprising the weights of the neural network, may be provided S400, but the weights may still have to be initialized S410 and/or modified S420. The learning S40 of the set of neural networks may comprise initializing S410 the respective weights of each neural network and/or modifying S420 the respective weights of the neural networks. The modifying S420 of the respective weights may be part of a training, as previously discussed. The training may be a simultaneous training of all the neural networks and may be based on a dataset, as previously discussed. In examples, it means that the training of each neural network is based on the whole dataset. Alternatively or additionally, it may mean that the training of each respective neural network is based on a respective sub-dataset of the dataset, the dataset comprising one or more respective sub-datasets, each sub-dataset forming at least a part of the dataset. Hereinafter, "the dataset" refers to a dataset on which the training of the set of neural networks Is carried out as just discussed.

In examples, the initializing S410 of the respective weights is carried out after the providing S400 of the set of neural networks and before the modifying S420 of the respective weights. The initializing S410 of the respective weights generally comprise specifying (e.g. declaring), for example by user-interaction, the values of each respective weight of each neural network of the set. In examples, the respective weights of each neural network may be all initialized S410 to a value that is lower than a predetermined threshold. The predetermined threshold may be provided by a user. The predetermined threshold may be lower than 1, 0.5, 0.1 or 0.001.

In examples, it is not the weights that are to be initialized close to zero at the beginning, but the output of the neural network that is to be close to zero whatever the input (reasonable). In practice, however, given the architectures used, putting weak weights at the initializing S410 makes it possible to ensure that the neural network will begin by predicting weak deformations. So, in examples, there is no threshold per se, everything depends on the architecture used. In such examples, the initializing S420 may be carried out such that the output of the neural network predicts small distortions before learning starts.

Initializing S410 the respective weights of a neural network to a value that is lower than such a predetermined threshold is particularly adapted to learn a neural network configured for inference of deformations of a respective base template each into 3D modeled objects. In such cases, one may require the output of the neural network to be small, i.e. to be a small deformation of the respective base template, whatever is the input of the neural network. Indeed, if the respective base template represents a centroid of a sub-dataset of the dataset, the respective base template needs not being deformed much and/or roughly to be transformed into a 3D modeled object of the sub-dataset. By initializing S410 the weights of the neural network in such a way, the learning S40 ensures that the neural network will start is training by outputting 3D modeled objects of the sub-dataset. In other words, the neural network will specialize right from the initializing S410 of its respective weights into inference of deformations of the respective base template into 3D modeled objects of the sub-dataset of which the respective base template is a centroid.

The modifying S420 of the respective weights of the neural networks is now discussed.

The modifying S420 of the respective weights of the neural networks is carried out by minimizing a loss which, for each 3D modeled object of the dataset, selects a term among a plurality of terms, each term penalizing a disparity between the 3D modeled object and a respective 3D modeled object inferred by a respective neural network of the set, the selected term being a term among the plurality of terms for which the disparity is the least penalized.

By "modifying the respective weights of the neural networks", it is meant that at least a part (e.g. all) of the respective weights of at least a part (e.g. all) of the neural networks are modified, for examples iteratively, e.g. during an iterative minimizing of the loss. For instance, the minimizing of the loss may comprise the execution of one or more algorithms, and (e.g. all the) steps of at least a part of the one or more algorithms may modify the respective weights when executed. The minimizing of the loss may use any deep learning techniques, such as ADAM solver over mini-batches.

The loss may be a quantity (e.g. a function) which, for each 3D modeled object of the dataset, measures two or more (e.g. geometric) respective similarities and/or a dissimilarities between the 3D modeled object and a respective 3D modeled object inferred by a respective neural network. Each term of the plurality of terms may be a measure of a respective one of the two or more (e.g. geometric) respective similarities and/or dissimilarities. Thus, the disparity, penalized by the term, between the 3D modeled object and the respective 3D modeled object inferred by the respective neural network may be a quantification of a (e.g. geometric) dissimilarity between the 3D modeled object and the respective 3D modeled object inferred by the respective neural network. Penalizing the disparity may thus mean that the term is an increasing function of the disparity. The loss selects, among the plurality of terms, and for each 3D modeled object of the dataset a term that is the least penalized. In examples, it means that the loss is a function that takes as parameters the 3D modeled objects of the dataset and as input the set of neural networks, and that outputs a quantity (e.g. a positive real number) which is a function (for instance a sum) of each term which is selected for each 3D modeled object. In other words, the loss may output a result expressing, for each 3D modeled object of the dataset, which neural network infers a respective 3D modeled object which is (e.g. the most) similar (e.g. geometrically) to the 3D modeled object.

In examples, the disparity between the 3D modeled object and the respective 3D modeled object inferred by the respective neural network of the set involves a distance between the 3D modeled object and the respective 3D modeled object inferred by the respective neural network of the set.

The distance is a particularly simple and efficient manner of measuring similarity and/or dissimilarity between 3D modeled objects.

The distance may be any distance, such as a Haussdorf distance, a Wasserstein distance, a Chamfer distance or an Earth Mover's distance. In examples, the disparity involves the distance between the 3D modeled object and the respective 3D modeled object inferred by the respective neural network of the set in that the disparity is a (e.g. increasing) function of the distance between the 3D modeled object and the respective 3D modeled object inferred by the respective neural network of the set. In examples, the disparity involves the distance between the 3D modeled object and the respective 3D modeled object inferred by the respective neural network of the set in that the disparity depends on a result relative to the computation of the distance between the 3D modeled object and the respective 3D modeled object inferred by the respective neural network of the set.

In examples, the distance is a distance between a first point cloud representing the 3D modeled object and a second point cloud representing the respective 3D modeled object inferred by the respective neural network of the set.

As previously discussed, each 3D modeled object of the dataset may be provided as a point cloud (thus, which represents the 3D modeled object), or a point cloud representing the 3D modeled object may be determined from another format into which the 3D modeled object is provided. In any case, the modifying S420 may manipulate point clouds representing each a 3D modeled object of the dataset. Being 3D modeled objects as well, the respective 3D modeled objects inferred by the respective neural networks of the set may also be represented by respective point clouds, which optionally may be determined from other 3D modeled object formats. Thus, the distance may be any distance between point clouds, such as a Wasserstein distance or an Earth Mover's distance.

In examples, each neural network is configured for inference of deformations of a respective base template each into a respective 3D modeled object. In these examples, each respective base template is a 3D modeled object.

In examples, each respective base template is a 3D modeled object which represents a centroid of the 3D modeled objects of a sub-dataset of the dataset.

In examples, the loss is of the type:

$$L_2(g_1 \circ f_1, \ldots, g_k \circ f_k) = \sum_{i=1}^{n} \min_{j=1,\ldots k} D_2(S_j, x_i),$$

where:
$g_1 \circ f_1, \ldots, g_k \circ f_k$ is the set of neural networks;
$x_1, x_2, \ldots, x_n$ are the 3D modeled objects of the dataset;
$S_1, S_2, \ldots, S_k$ are the respective base templates; and $D_2(S_j, x_i)$ is a term involving a distance between a 3D modeled object $x_i$ and a deformation of a respective base template $S_j$ inferred by a respective neural network $g_j \circ f_j$.

In examples, $D_2$ is the Chamfer distance loss:

$$D_2(S_j, x_i) = \left[ \sum_{y \in S_j} \min_{z \in x_i} \|y + g_j(f_j(x_i), y) - z\|_2^2 + \sum_{z \in x_i} \min_{y \in S_j} \|y + g_j(f_j(x_i), y) - z\|_2^2 \right].$$

In examples, the minimizing comprises iterations of: selecting a set of 3D modeled objects of the dataset and, for each 3D modeled object of the selected set, assigning to the 3D modeled object a respective neural network by rewarding smallness of the disparity between the 3D modeled object and the respective 3D modeled object inferred by the respective neural network. In these examples, each respective neural network is assigned to one or more 3D modeled objects of the selected set. In these examples, weights of each respective neural network are modified as a result of the assigning.

The iterations of the selecting may be carried out until each 3D modeled object of the dataset has been selected at least once and/or until each 3D modeled object of the dataset has a respective neural network assigned to it. Assigning the respective neural network to the 3D modeled object of the selected set may comprise assessing each term of the loss penalizing the disparity between the 3D modeled object and a respective 3D modeled object inferred by a respective neural network. Assigning the respective neural network to the 3D modeled object of the selected set may further comprise assessing a term for which the disparity is the least penalized. In examples, the respective neural network corresponding to the disparity penalized by the assessed term is the one assigned to the 3D modeled object.

In other words, the modifying S420 method iteratively visits sets of 3D modeled objects in the dataset and assigns to each 3D modeled object of each set the respective neural network which infers a respective 3D modeled object which is (e.g. the most) similar (e.g. geometrically) to the 3D modeled object. Thus, for each respective neural network, one or more 3D modeled objects are iteratively assigned to the respective neural network. Weights of the respective neural network are modified at each assigning. In examples, it means that weights of the respective neural network are modified so that the respective neural network is configured to infer at least each 3D modeled object currently being assigned and previously assigned to the respective neural network.

Thus, the modifying S420 iteratively explores the 3D modeled objects of the set and iteratively assigns the respective neural networks to one or more 3D modeled objects. The weights may also be modified iteratively so that each respective neural network specializes at least in inferring the 3D modeled objects assigned to it. In other words, the modifying S420 may operate a selection of one or more sub-datasets (e.g. classes) of 3D modeled objects of the dataset and, substantially simultaneously, modify the respective weights of each respective neural network so that each respective neural network specializes in inferring 3D modeled objects of a respective one of the sub-datasets.

An implementation of an example where each respective neural network is a respective autoencoder which comprises a respective decoder configured for the inference of the 3D modeled objects is now discussed.

In this implementation, let $\{S_1, \ldots, S_k\}$ be k determined S30 base templates determined S30, with k≥2. The learning S50 consists in learning k autoencoders $g_1 \circ f_1, \ldots, g_k \circ f_k$, one for each base template. Each encoder takes as input a sampling x of an input 3D mesh representing a 3D modeled object, based on earlier cited papers [8,9,10,11]. Each decoder $g_j$ predicts a deformation of the base template $S_j$, by taking as input the latent vector $f_j(x)$, as well as a 3D coordinate y, and the deformed template is obtained as $S_j + g_j(f_j(x), S_j)$. Each decoder is initialized such as to predict a small deformation before the learning starts. This may include initializing S410 the respective weights of each decoder to an initial value that is lower than a predetermined threshold, as previously discussed. The respective weights are modified S420 by minimizing (using standard deep learning techniques, such as ADAM solver over mini-batches) the following Chamfer distance loss:

$$L_2(g_1 \circ f_1, \ldots, g_k \circ f_k) = \sum_{i=1}^{n} \min_{j=1,\ldots,k} \left[ \sum_{y \in S_j} \min_{z \in x_i} \|y + g_j(f_j(x_i), y) - z\|_2^2 + \sum_{z \in x_i} \min_{y \in S_j} \|y + g_j(f_j(x_i), y) - z\|_2^2 \right]$$

where $$D_2(X, Z) = \sum_{y \in Y} \min_{z \in Z} \|y - z\|_2^2 + \sum_{z \in Z} \min_{y \in Y} \|y - x\|_2^2$$

is the Chamfer distance.

The loss may be minimized by using a reassignment algorithm analogous to the first reassignment algorithm or to the second reassignment algorithm that have been previously described. This allows re-assigning of $$\min_{j=1,\ldots,k}$$

and it's argmin to force each autoencoder to be optimized by at least a few 3D modeled objects of each mini-batch during training. As, in this implementation, the autoencoders start from the base templates, it is easy for them to specialize on the kind of 3D modeled object represented by their associated base template. Moreover, they only need to deform slight this base template to match an input, so the autoencoders ensure a more consistent topology of their outputs.

An implementation of the process is now discussed.

In this implementation, the process learns several autoencoders onto meshes, where each autoencoder automatically specializes itself on a specific kind of topology. Each decoder also deforms its own base template, the base templates being automatically determined S30 to represent the different kinds of base shapes existing in the provided S10 dataset. This allows learning of a manifold with a better accuracy and a lower reconstruction loss, efficiently handle different topologies, and ensure that the reconstructed shapes share a more consistent topology.

This implementation of the process comprises four stages 1, 2, 3 and 4, which are now discussed.

1. Sample the Dataset

Let $\{x_1, x_2, \ldots, x_n\}$ be a provided S10 dataset of 3D meshes, typically belonging to a same class of objects (for instance, a dataset of chairs). The process comprises extracting a point cloud from each shape in the dataset by raycasting each model on six orthographic views. The process further comprises uniformly sub-sample each point cloud to get a fixed number of points m. To do so, the process starts by a random point of the point cloud, and iteratively picks the furthest point of the point cloud from the already selected points, until we reach a number of m points. Now $\{x_1, x_2, \ldots, x_n\}$ represents the sampled point cloud of the training meshes. The process further centers the center the shapes and apply a unit ball scaling.

2. Learn the Base Templates—Determining S30 k Base Templates

The process starts from k unit spheres $S_1, \ldots, S_k$ with m points each. The process adds a very small noise to each sphere, such that each sphere is very slightly different from each other.

The process uses the relaxation algorithm presented in earlier cited paper [12] to optimize the points of each sphere in order to minimize (by mini-batches stochastic gradient descent) the following Earth Mover's distance loss:

$$L_1(S_1, \ldots, S_k) = \sum_{i=1}^{n} \min_{j=1,\ldots,k} \min_{\substack{\varphi: S_j \to x_i \\ \varphi \text{ bijective}}} \sum_{y \in S_j} \|y - \varphi(y)\|_2^2$$

where $$D_1(S_j, x_i) = \min_{\substack{\varphi: S_j \to x_i \\ \varphi \text{ bijective}}} \sum_{y \in S_j} \|y - \varphi(y)\|_2^2$$

is the Earth Mover's distance loss between the template $S_j$ and the shape $x_i$.

Each sphere will be optimized in a base template shape representing a kind of shape different from the other optimized spheres, since for each training model the minimum will only optimize the nearest sphere. Each sphere will specialize itself in a specific base template, representative of a specific topology and kind of shape, different from the others. Each base template may be interpreted as a centroid of its own cluster in the space of 3D models (provided with the Earth Mover's distance).

In order to force each sphere to specialize to its own shape, the process also uses a reassignment algorithm during mini-batches training. Indeed, it could happen that all shapes reach their minimum loss for the same base template, impeding the other spheres to be optimized. The reassignment algorithm may be one of the previously discussed first reassignment algorithm and second reassignment algorithm.

The loss $L_1$ optimizes the vertices of the spheres but does not take into account the topology. This leads to base templates with accurate point clouds but wrong topology. Thus, the process comprises remeshing the base templates. To do so, the process puts each base template in a coarse 3D grid, where each voxel containing a point has value 1, the other voxels having a null value. Then, the process comprises apply the marching cubes algorithm, with an isovalue near 1, to extract a coarse mesh for each base template. The process uses the coarse mesh from the marching cubes algorithm in order to compute accurate normals for each point of each base template. The process simply projects each point onto the nearest triangle of the coarse mesh and assigns for its normal the weighted average of the normals of the triangle, the weights being the barycentric weights of the projected point. With these proper normals, the process runs a Poisson surface reconstruction, in order to get a base template with an accurate topology that the process may ultimately decimate if there are too many vertices. Now $(S_1, \ldots, S_k)$ represents the k learnt base templates. Notice that each base template is homeomorphic to a sphere.

3. Learn the Manifold—Learning S40 k Autoencoders

The process further comprises learning k autoencoders $g_1 \circ f_1, \ldots, g_k \circ f_k$, one for each base template. Each encoder takes as input a sampling x of the input mesh, based on earlier cited papers [8,9,10,11]. Each decoder $g_j$ predicts a deformation of the base template $S_j$, by taking as input the latent vector $f_j(x)$, as well as a 3D coordinate y, and the deformed template is obtained as $S_j + g_j(f_j(x), S_j)$. Each decoder is initialized such as to predict a small deformation before the learning starts.

The autoencoders are learnt by minimizing (using standard deep learning techniques, such as ADAM solver over mini-batches) the following Chamfer distance loss:

$$L_2(g_1 \circ f_1, \ldots, g_k \circ f_k) = \sum_{i=1}^{n} \min_{j=1,\ldots,k} \left[ \sum_{y \in S_j} \min_{z \in x_i} \|y + g_j(f_j(x_i), y) - z\|_2^2 + \sum_{z \in x_i} \min_{y \in S_j} \|y + g_j(f_j(x_i), y) - z\|_2^2 \right]$$

where $$D_2(X, Z) = \sum_{y \in Y} \min_{z \in Z} \|y - z\|_2^2 + \sum_{z \in Z} \min_{y \in Y} \|y - x\|_2^2$$

is a function of the Chamfer distance.

The process also uses the exact same partition algorithm as in the previous stage, in order to re-assign $$\min_{j=1,\ldots,k}$$

and its argmin to force each autoencoder to be optimized by at least a few shapes of each mini-batch during training. As the autoencoders start from the base templates, it is easy for them to specialize on the kind of shapes represented by their associated base template. Moreover, they only need to deform slight this base template to match an input, so the autoencoders ensure a more consistent topology of their outputs.

4. Turn the Manifold into a Generative Model

Now that the manifold is learned, the process may also fit a gaussian mixture model for each latent space of each autoencoder, in order to be able to sample and synthetize new shapes. For each autoencoder, the process takes the training shapes which are best reconstructed by this autoencoder and use these shapes to initialize a k-means clustering, before performing an expectation-maximization to fit the gaussian mixture. The gaussian mixture gives a probabilistic distribution function over each latent space that we can easily sample.

It is further provided a computer program comprising instructions for performing the template-learning method, the manifold-learning method, the process and/or the method of use.

It is further provided a device comprising a data storage medium having recorded thereon the program and/or the neural network and/or the set of neural networks. The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g. the device is a subsystem of the overall system). The system may further comprise a graphical user interface coupled to the processor.

The system and the program are now discussed.

Figure 20:
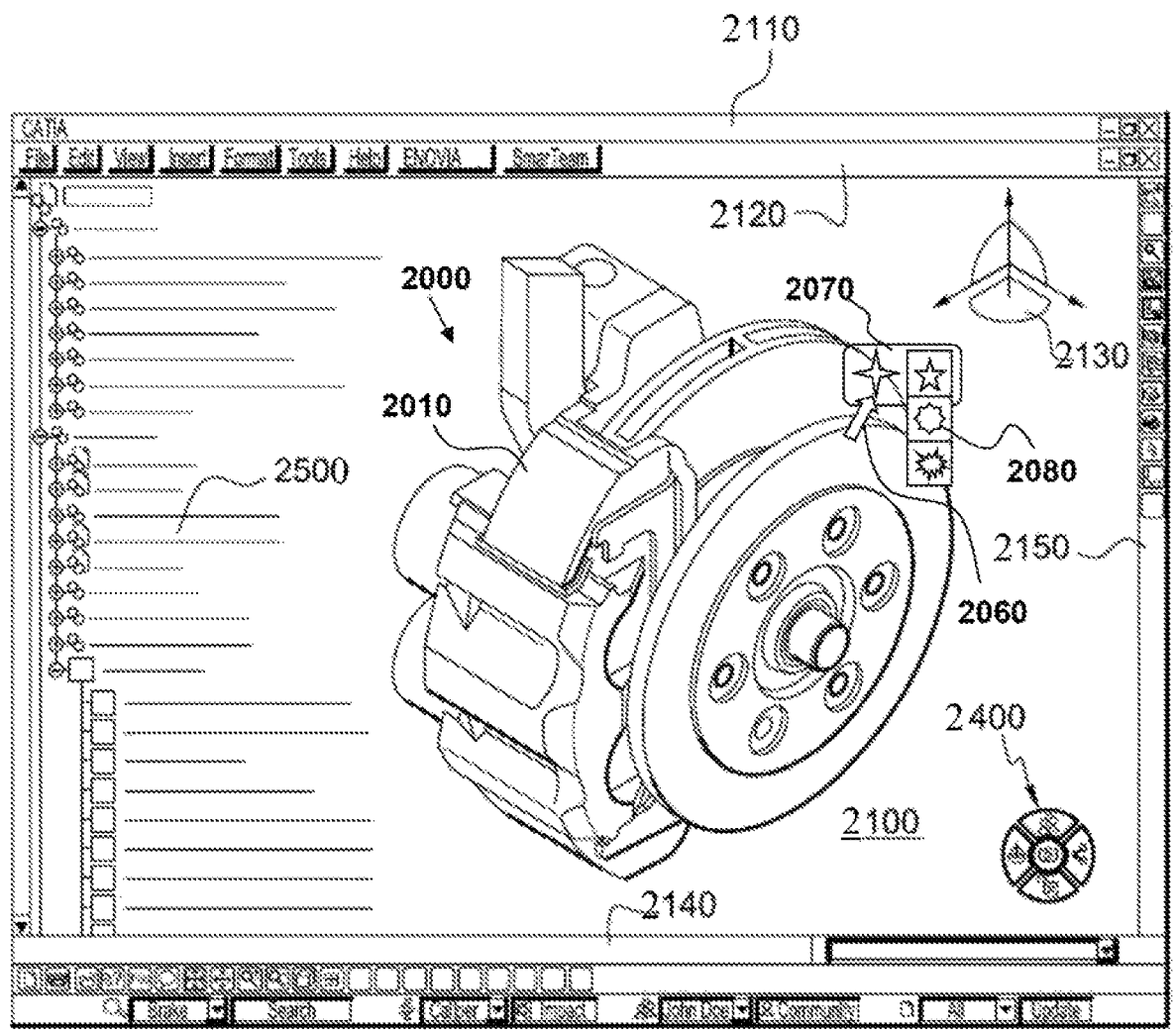
FIG. 20 shows an example of a graphical user interface of the system.
Figure 21:
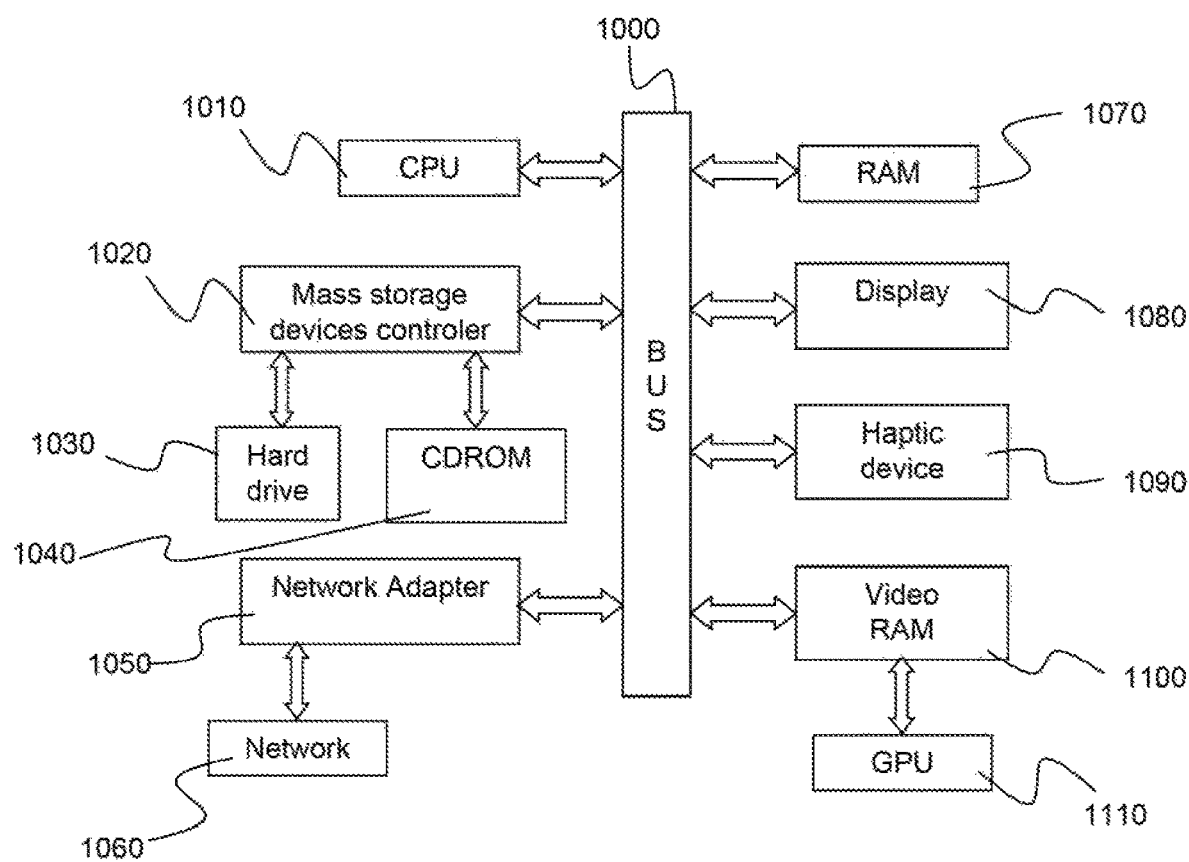
FIG. 21 shows an example of the system.

FIG. 20 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

FIG. 22 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the template-learning method, the manifold-learning method and/or the process. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Process/method steps (that is steps of the template-learning method, the manifold-learning method and/or the process) may be performed by a programmable processor executing a program of instructions to perform functions of the process by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the template-learning method, the manifold-learning method and/or the process.

The invention claimed is:

1. A computer-implemented method of machine-learning, the method comprising:
   obtaining:
      a dataset including 3D modeled objects which each represent a respective mechanical part, and
      a set of neural networks, each neural network having respective weights, each neural network being configured for inference of 3D modeled objects; and
   modifying respective weights of the neural networks by minimizing a loss which, for each 3D modeled object of the dataset, selects a term among a plurality of terms, each respective term of the plurality of terms being a measure of a disparity between the 3D modeled object and a respective 3D modeled object inferred by a respective neural network of the set, the respective term penalizing the disparity the selected term being a term among the plurality of terms for which the disparity is the least penalized.

2. The method of claim 1, wherein the disparity between the 3D modeled object and the respective 3D modeled object inferred by the respective neural network of the set involves a distance between the 3D modeled object and the respective 3D modeled object inferred by the respective neural network of the set.

3. The method of claim 2, wherein the distance is a distance between a first point cloud representing the 3D modeled object and a second point cloud representing the respective 3D modeled object inferred by the respective neural network of the set.

4. The method of claim 1, wherein each neural network is configured for inference of deformations of a respective base template each into a respective 3D modeled object, each respective base template being a 3D modeled object.

5. The method of claim 4, wherein each respective base template is a 3D modeled object which represents a centroid of the 3D modeled objects of a sub-dataset of the dataset.

6. The method of claim 4, wherein the loss is of the type:

$$L_2(g_1 \circ f_1, \ldots, g_k \circ f_k) = \sum_{i=1}^{n} \min_{j=1,\ldots,k} D_2(S_j, x_i),$$

where:
$g_1 \circ f_1, \ldots, g_k \circ f_k$ is the set of neural networks;
$x_1, x_2, \ldots, x_n$, are the 3D modeled objects of the dataset;
$S_1, S_2, \ldots, S_k$ are the respective base templates; and
$D_2(S_j, x_i)$ is a term involving a distance between a 3D modeled object $x_i$ and a deformation of a respective base template $S_j$ inferred by a respective neural network $g_j \circ f_j$.

7. The method of claim 1, wherein the minimizing includes iterations of:
selecting a set of 3D modeled objects of the dataset;
for each 3D modeled object of the selected set, assigning to the 3D modeled object a respective neural network by rewarding smallness of the disparity between the 3D modeled object and the respective 3D modeled object inferred by the respective neural network, each respective neural network being assigned to one or more 3D modeled objects of the selected set, weights of each respective neural network being modified as a result of the assigning.

8. The method of claim 1, wherein each respective neural network is a respective autoencoder which includes a respective decoder configured for the inference of the 3D modeled objects.

9. A computer-implemented method of applying a set of neural networks obtainable according to a method of machine-learning, the method of machine-learning comprising:
obtaining:
a dataset including 3D modeled objects which each represent a respective mechanical part, and
the set of neural networks, each neural network having respective weights, each neural network being configured for inference of 3D modeled objects; and
modifying respective weights of the neural networks by minimizing a loss which, for each 3D modeled object of the dataset, selects a term among a plurality of terms, each respective term of the plurality of terms being a measure of a disparity between the 3D modeled object and a respective 3D modeled object inferred by a respective neural network of the set, the respective term penalizing the disparity, the selected term being a term among the plurality of terms for which the disparity is the least penalized.

10. The method of claim 9, wherein the disparity between the 3D modeled object and the respective 3D modeled object inferred by the respective neural network of the set involves a distance between the 3D modeled object and the respective 3D modeled object inferred by the respective neural network of the set.

11. The method of claim 10, wherein the distance is a distance between a first point cloud representing the 3D modeled object and a second point cloud representing the respective 3D modeled object inferred by the respective neural network of the set.

12. The method of claim 9, wherein each neural network is configured for inference of deformations of a respective base template each into a respective 3D modeled object, each respective base template being a 3D modeled object.

13. The method of claim 9, wherein each neural network is a respective autoencoder which includes a respective decoder configured for the inference of the 3D modeled objects, the method comprising:
obtaining two or more 3D modeled objects;
projecting the two or more 3D modeled objects each on a latent space of a respective autoencoder of the set of neural networks:
computing one or more interpolations, on the latent space, between the projected two or more 3D modeled objects; and
applying the decoder to each computed interpolation.

14. The method of claim 9, wherein each neural network is a respective autoencoder which includes a respective decoder configured for the inference of the 3D modeled objects, the method comprising:
obtaining a part of a 3D modeled object;
applying a respective autoencoder to the part of the 3D modeled object; and
fitting, to the part of the 3D modeled object, the result of the applying of the respective autoencoder to the part of the 3D modeled object.

15. The method of claim 9, wherein each neural network is a respective autoencoder which comprises a respective decoder configured for the inference of the 3D modeled objects, the method comprising:
obtaining a 3D modeled object;
applying one or more respective autoencoders to the 3D modeled object; and
selecting a respective autoencoder based on the applying.

16. A device comprising:
a processor; and
a non-transitory data storage medium having recorded thereon a computer program comprising instructions for machine-learning that when executed by the possessor cause the processor to be configured to:
obtain a dataset including 3D modeled objects which each represent a respective mechanical part,
obtain a set of neural networks, each neural network having respective weights, each neural network being configured for inference of 3D modeled objects, and
modify respective weights of the neural networks by minimizing a loss which, for each 3D modeled object of the dataset, selects a term among a plurality of terms, each respective term of the plurality of terms being a measure of a disparity between the 3D modeled object and a respective 3D modeled object inferred by a respective neural network of the set, the respective term penalizing the disparity, the selected term being a term among the plurality of terms for which the disparity is the least penalized.

17. The device of claim 16, wherein the disparity between the 3D modeled object and the respective 3D modeled object inferred by the respective neural network of the set involves a distance between the 3D modeled object and the respective 3D modeled object inferred by the respective neural network of the set.

18. The device of claim 17, wherein the distance is a distance between a first point cloud representing the 3D modeled object and a second point cloud representing the respective 3D modeled object inferred by the respective neural network of the set.

19. The device of claim 16, wherein each neural network is configured for inference of deformations of a respective base template each into a respective 3D modeled object, each respective base template being a 3D modeled object.

20. A non-transitory computer readable medium having stored thereon a program that when executed by a computer causes the computer to implement the method according to claim 1.

* * * * *